(12) United States Patent
Okada et al.

(10) Patent No.: US 9,086,807 B2
(45) Date of Patent: Jul. 21, 2015

(54) STORAGE APPARATUS AND TIER CONTROL METHOD

(71) Applicant: Hitachi, Ltd., Tokyo (JP)

(72) Inventors: Gosuke Okada, Tokyo (JP); Takashi Chikusa, Tokyo (JP); Keiichiro Uchida, Tokyo (JP); Megumi Hokazono, Tokyo (JP); Naoto Shiino, Tokyo (JP); Mamoru Motonaga, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/359,918

(22) PCT Filed: Aug. 26, 2013

(86) PCT No.: PCT/JP2013/072710
§ 371 (c)(1),
(2) Date: May 22, 2014

(87) PCT Pub. No.: WO2015/029102
PCT Pub. Date: Mar. 5, 2015

(65) Prior Publication Data
US 2015/0160858 A1 Jun. 11, 2015

(51) Int. Cl.
*G06F 12/00* (2006.01)
*G06F 3/06* (2006.01)
*G11C 16/10* (2006.01)
*G06F 12/02* (2006.01)

(52) U.S. Cl.
CPC .............. *G06F 3/061* (2013.01); *G06F 3/0619* (2013.01); *G06F 3/0655* (2013.01); *G06F 3/0665* (2013.01); *G06F 3/0689* (2013.01); *G06F 12/0246* (2013.01); *G11C 16/102* (2013.01)

(58) Field of Classification Search
None
See application file for complete search history.

(56) References Cited

U.S. PATENT DOCUMENTS

| | | | |
|---|---|---|---|
| 2010/0057978 A1 | 3/2010 | Takamura et al. | |
| 2011/0271071 A1* | 11/2011 | Nakatogawa | 711/165 |
| 2012/0246430 A1 | 9/2012 | Takahashi et al. | |
| 2013/0145092 A1 | 6/2013 | Miwa et al. | |
| 2013/0262749 A1* | 10/2013 | Oikawa et al. | 711/103 |

FOREIGN PATENT DOCUMENTS

| | | |
|---|---|---|
| JP | 2008-047156 A | 2/2008 |
| JP | 2010-055210 A | 3/2010 |
| JP | 2011-233009 A | 11/2011 |
| WO | 2013/038510 A1 | 3/2013 |
| WO | 2013/094041 A1 | 6/2013 |

* cited by examiner

*Primary Examiner* — Brian Peugh
(74) *Attorney, Agent, or Firm* — Mattingly & Malur, PC

(57) ABSTRACT

A storage apparatus and tier control method capable of executing hierarchical control based on variable performance of SSDs are suggested. With a storage apparatus equipped with a plurality of drives composed of flash memories, the storage apparatus includes a controller for hierarchically controlling storage areas provided by the plurality of drives by classifying the storage areas into a plurality of tiers with different performances and managing them, wherein the controller: decides a first tier, to which each of the drives should belong, based on performance of the drive; decides to change the tier, to which the drive should belong, from the first tier to a second tier different from the first tier based on the drive's performance, which varies depending on property of the drive; and changes the tier, to which the drive determined to change its tier should belong, from the first tier to the second tier.

14 Claims, 17 Drawing Sheets

11211

| SSD Number | Tier |
|---|---|
| SSD1 | Tier H |
| SSD2 | Tier L |
| SSD3 | Tier M |
| SSD4 | Tier H |

| SSD Number | Tier |
|---|---|
| SSD1 | Tier H |
| SSD2 | Tier L |
| SSD3 | Tier M |
| SSD4 | Tier H |

| SSD Number | Performance Value | Rank Order |
|---|---|---|
| SSD1 | 5000 IOPS | 2 |
| SSD2 | 2000 IOPS | 4 |
| SSD3 | 3000 IOPS | 3 |
| SSD4 | 10000 IOPS | 1 |

| SSD Type Name | performance value |
|---|---|
| ABC | 1000 IOPS |
| PQR | 2000 IOPS |
| XYZ | 3000 IOPS |

| SSD Number | Number of Writes | Write Capacity | Operation Time |
|---|---|---|---|
| SSD1 | 10000 | 5GB | HH:MM:SS |
| SSD2 | 10000 | 5GB | HH:MM:SS |
| SSD3 | 5000 | 2GB | HH:MM:SS |
| SSD4 | 1000 | 1GB | HH:MM:SS |

| Tier | Total Capacity | Unused Capacity |
|---|---|---|
| Tier H | 10000GB | 8000GB |
| Tier M | 3000GB | 24000GB |
| Tier L | 8000GB | 39000GB |

| Vendor Name | Model Type | Life | Perfor-mance | Performance Degradation Degree | Recovery Method | Recovery Capability |
|---|---|---|---|---|---|---|
| Vendor A | High Performance Model | Long | High Speed | High | Sequential Write | High |
| Vendor A | Inexpensive Model | Long | Medium Speed | High | Sequential Write | High |
| Vendor B | High Performance Model | Short | High Speed | Low | Sequential Write | High |
| Vendor B | Inexpensive Model | Short | High Speed | High | Sequential Write | Low |
| Vendor C | High Performance Model | Long | Medium Speed | Low | I/O Suppression | Low |
| Vendor C | Inexpensive Model | Long | Low Speed | Low | I/O Suppression | Low |

| Item | Parameter | Schedule |
|---|---|---|
| Life | Long | Lower tier rank 12 months later |
| | Short | Lower tier rank 6 months later |
| Performance | High Speed | Upon initial installment: locate it in high-rank tier |
| | Medium Speed | Upon initial installment: locate it in medium-rank tier |
| | Low Speed | Upon initial installment: locate it in low-rank tier |
| Performance Degradation Degree | Low | Lower tier rank 36 months later |
| | High | Lower tier rank 1 month later |
| Recovery Method | Sequential Write | Raise tier rank 1 month after lowering tier rank |
| | I/O Suppression | Raise tier rank 1 month after lowering tier rank |
| Recovery Capability | High | Raise tier rank 6 months after lowering tier rank |
| | Low | Keep tier at lower rank |

| | | | | | | | |
|---|---|---|---|---|---|---|---|
| SSD Type Name: ABC | | | | | | | |
| Elapsed Time Period | 1 month | 2 months | 3 months | 4 months | ... | 12 months | N year(s) |
| Field Performance | High | High | Medium | Low | ... | High | End of Life |
| Tier Location Schedule | Tier H | Tier H | Tier M | Tier L | ... | Tier H | Tier L (Replacement Request) |
| SSD Type Name: XYZ | | | | | | | |
| Elapsed Time Period | 1 month | 2 months | 3 months | 4 months | ... | 12 months | N year(s) |
| Field Performance | Medium | Medium | Medium | Medium | ... | Low | Low |
| Tier Location Schedule | Tier M | Tier M | Tier M | Tier M | ... | Tier L | Tier L |

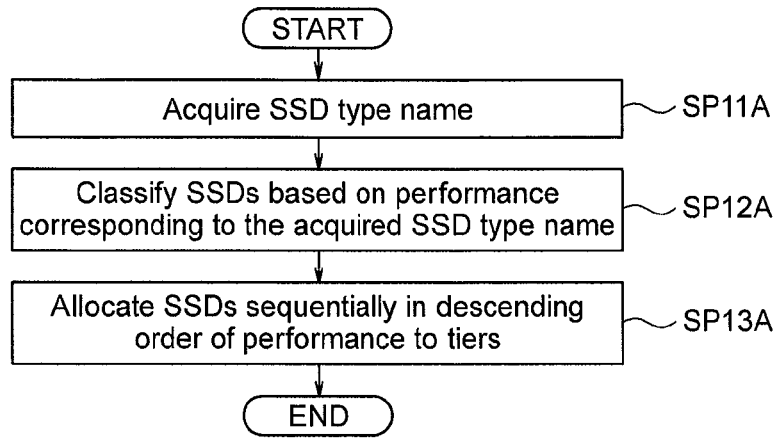
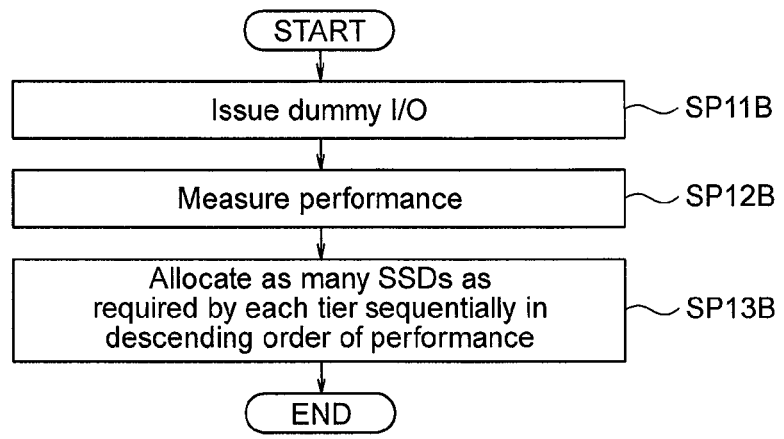
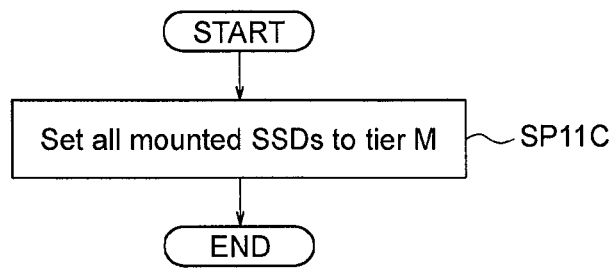

STORAGE APPARATUS AND TIER CONTROL METHOD

TECHNICAL FIELD

The present invention relates to a storage apparatus and tier control method. Particularly, the invention is suited for use in a storage apparatus whose all storage media are composed of SSDs and is also suited for in a tier control method for managing storage areas by classifying them into a plurality of tiers.

BACKGROUND ART

In recent years, there is a demand for performance enhancement of storage apparatuses along with the advancement of technologies. Particularly, there is a demand for storage of data, which continue to increase dramatically, and for high-speed I/O (Input/Output) processing on the storage media.

Patent Literature 1 discloses a technique to hierarchize and control storage areas. According to the technique described in this Patent Literature 1, the storage areas are hierarchized and managed based on I/O performance and reliability. Then, on the basis of access frequency, data which require the I/O performance are located in a high tier; and on the other hand, data which do not require the I/O performance are located in a low tier. Moreover, data are migrated as appropriate between the tiers based on the status of the I/O processing. Accordingly, it is intended to process inputs and outputs at high speed.

CITATION LIST

Patent Literature

[Patent Literature 1] Japanese Patent Application Laid-Open (Kokai) Publication No. 2008-47156

SUMMARY OF INVENTION

Problems to be Solved by the Invention

Meanwhile, the technique described in Patent Literature 1 utilizes the differences between performances of storage media when hierarchizing the storage areas. HDDs (Hard Disk Drives) are used as the storage media; and in recent years SSDs (Solid State Drives) composed of flash memories are also used as well as the HDDs. The SSDs are characterized, as compared to the HDDs, in that although they are involatile, they can process inputs and outputs at high speed.

Regarding the SSDs which are currently mainstream media, flash memory devices are used for storage devices and a thin-provisioning-like technique called wear leveling processing is adopted to reduce the life for the number of rewrites. This control is a method of processing inputs and outputs by mapping positional information (LBA) about where data are stored from a host (example: storage controller) and an actual location indicating inside which device the data are actually stored. Therefore, logical-physical mapping information (metadata) increases together with stored data.

Furthermore, a technique called reclamation processing is also adopted for the SSDs in addition to the wear leveling processing. This is a technique used when receiving update (overwrite) data to aggregate and release old source data (invalid data) of the data written to another internal area by means of wear leveling processing and recycle the released area. Since invalid entries exist in the metadata until the reclamation processing is executed, database search efficiency in the metadata decreases. As the amount of metadata becomes enormous because of such a reason, I/O performance degrades due to an increase of a search overhead. The same can be said about a storage apparatus that adopts the thin provisioning method; and the increase of metadata associated with storage of the data causes the increase of the search overhead.

The technique described in Patent Literature 1 is to use the above-described HDDs and SSDs and perform hierarchical control of storage areas provided by the HDDs and SSDs by classifying the storage areas into a plurality of tiers. This hierarchical control is performed on the premise that the performance of the HDDs and SSDs will degrade as much as the storage areas provided by the HDDs and SSDs are used. Incidentally, the "performance" herein used means, for example, Iaps (Input Output Per Second).

However, the performance and life of the SSDs vary depending on the type of storage devices used (type such as SLC [Single-Level-Cell] or MLC [Multi-Level-Cell]), parallelism (such as bit number) of internal buses, and multiplicity of processing and the SSDs are characterized by recovery of their performance under specified conditions. This property of the SSDs varies depending on vendors. The above-described SSDs' property which varies depending on the vendors will be hereinafter referred to as the "property."

Specifically speaking, other than the aforementioned property that the performance will degrade as much as the storage areas are used, the SSDs have the property that the performance will recover by means of the execution of specified processing. This is assumed to be caused by internal factors of the SSDs that as a result of organization of invalid data entries in the metadata by the execution of, for example, the reclamation processing, the size of the metadata decreases and the search efficiency is thereby enhanced or the execution of sequential writing causes integration of a plurality of metadata entries, which results in reduction of the size of the metadata and similarly enhances the search efficiency.

The technique described in Patent Literature 1 does not consider the SSDs' performance differences and recovery property and, therefore, does not make good use of the best characteristic of the SSDs, as compared to the HDDs, that their performance changes. Particularly, when the performance of the SSDs has recovered, data should be migrated between tiers; however, the technique described in Patent Literature 1 does not consider data migration associated with the recovery of the SSDs' performance. Furthermore, the tier of the SSDs is not segmentalized and the property difference of rewrite life depending on the difference of the type of SSDs is not considered.

The present invention was devised in consideration of the above-described circumstances and suggests a storage apparatus and tier control method capable of executing hierarchical control based on variable performance and properties of SSDs.

Means for Solving the Problems

In order to solve the above-described problem, provided according to the present invention is a storage apparatus equipped with a plurality of drives composed of flash memories, the storage apparatus including a controller for hierarchically controlling storage areas provided by the plurality of drives by classifying the storage areas into a plurality of tiers with different performances and managing them, wherein the controller: decides a first tier, to which each of the drives should belong, based on performance of the drive; decides to change the tier, to which the drive should belong, from the first tier to a second tier different from the first tier based on the drive's performance, which varies depending on property of the drive; and changes the tier, to which the drive determined to change its tier should belong, from the first tier to the second tier.

In order to solve the above-described problem, provided according to the present invention is a tier control method for a storage apparatus including a controller for hierarchically controlling storage areas provided by a plurality of drives composed of flash memories by classifying the storage areas into a plurality of tiers with different performances and managing them, the tier control method including: a first step executed by the controller deciding a first tier, to which each of the drives should belong, based on performance of the drive; a second step executed by the controller deciding to change the tier, to which the drive should belong, from the first tier to a second tier different from the first tier based on the drive's performance, which varies depending on property of the drive; and a third step executed by the controller changing the tier, to which the drive determined to change its tier should belong, from the first tier to the second tier.

Advantageous Effects of Invention

According to the present invention, hierarchical control can be executed based on variable performance and property of SSDs.

BRIEF DESCRIPTION OF DRAWINGS

FIG. 3 is a logical configuration diagram of a tier management table.
FIG. 4 is a logical configuration diagram of an SSD measurement performance management table.
FIG. 5 is a logical configuration diagram of an SSD type name performance management table.
FIG. 6 is a logical configuration diagram of a write management table.
FIG. 7 is a logical configuration diagram of a tier capacity management table.
FIG. 8 is a logical configuration diagram of a property management table.
FIG. 9 is a logical configuration diagram of a schedule management table.
FIG. 10 is a logical configuration diagram of a field management table.
FIG. 15 is a flowchart illustrating another initial tier decision processing.
FIG. 16 is a flowchart illustrating another initial tier decision processing.
FIG. 17 is a flowchart illustrating another initial tier decision processing.

MODE FOR CARRYING OUT THE INVENTION

An embodiment of the present invention will be explained in detail with reference to drawings.

(1) First Embodiment (1-1) Overall Configuration

Figure 1:
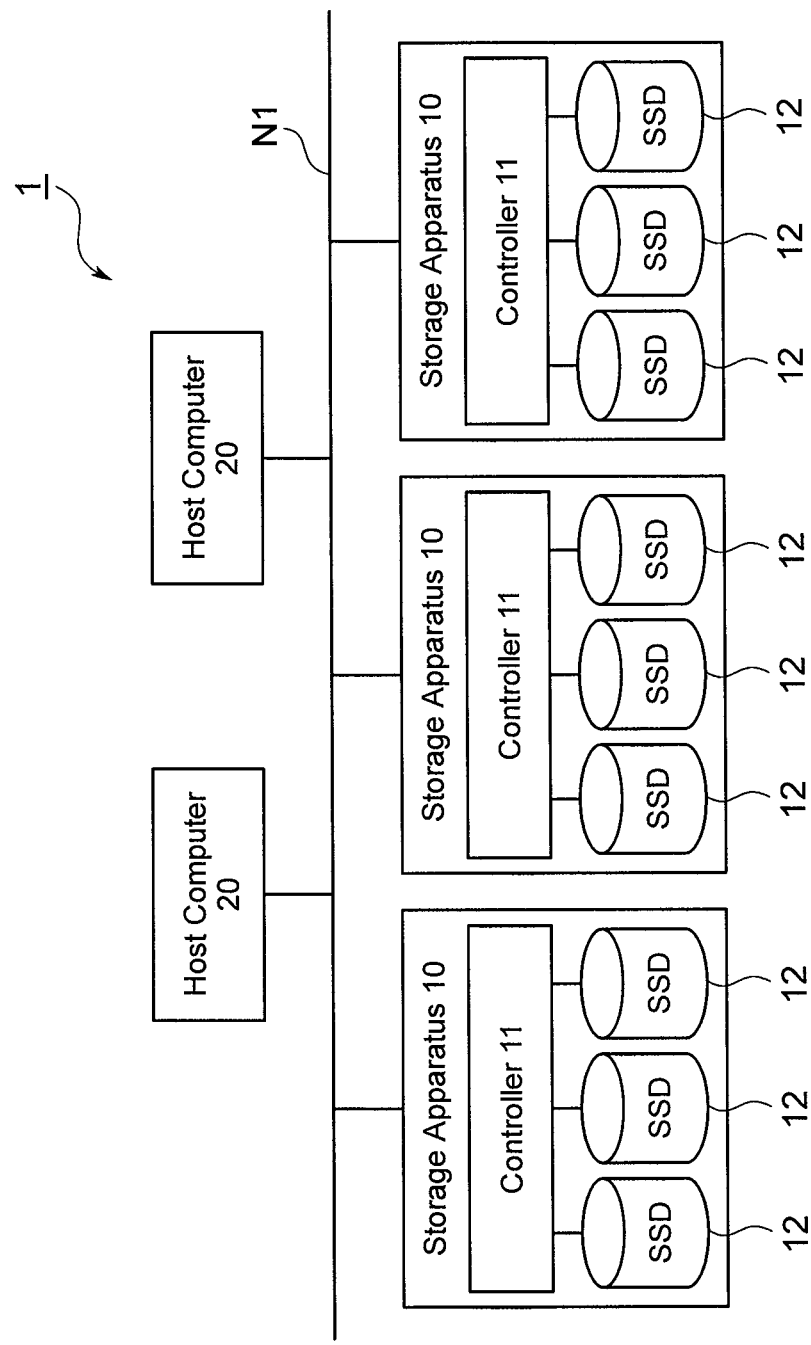
FIG. 1 is an overall configuration diagram of a storage system according to this embodiment.

FIG. 1 shows an overall configuration of a storage system 1 according to this embodiment. The storage system 1 is configured by including a storage apparatus 10 and a host computer 20. The storage apparatus 10 and the host computer 20 are connected via a communication line N1 so that they can communicate to each other. The communication line N1 is, for example, a LAN (Local Area Network) or a SAN (Storage Area Network).

The storage apparatus 10 includes a controller 11 and a plurality of SSDs (Solid State Drives) 12. The controller 11 and the plurality of SSDs 12 are connected via, for example, a SAN so that they can communicate with each other. The SSDs 12 are drives composed of flash memories.

After receiving a read request or a write request (hereinafter collectively referred to as the I/O request) from the host computer 20, the controller 11 accesses the SSDs 12 and reads data corresponding to the read request (read data) from the SSDs 12 or writes data corresponding to the write request (write data) to the SSDs 12. Also, the controller 11 according to this embodiment executes hierarchical control.

The hierarchical control is a control method for responding to an I/O request from the host computer 20 at high speed by classifying storage areas provided by the plurality of SSDs 12 into a plurality of tiers according to performance of each SSD 12, storing data with high access frequency in the SSDs 12 belonging to a tier of high performance (the SSDs 12 which provide storage areas belonging to the tier of high performance), and storing data with low access frequency in the SSDs 12 belonging to a tier of low performance (the SSDs 12 which provide storage areas belonging to the tier of low performance).

The term "performance" used in the expressions of the response performance, high performance, or low performance means IOPS (Input Output Per Second) or response time. When the term "response performance," "high performance," "low performance, or simply "performance" is used in the following explanation, it means an index based on this IOPS or response time. Also, a moving average, excess moving average, differential value, or changed amount of the IOPS and the response time may sometimes be used as the index for the performance as the need arises.

Moreover, general hierarchical control which is already known performs control of storage areas provided by different types of storage media (such as SSD, SAS, and SATA) by classifying them into, for example, tier 1, tier 2, and tier 3 and storing data in the storage area belonging to any one of tiers 1 to 3, while monitoring access frequency of the stored data and relocating the storage area to store the data based on the access frequency.

Therefore, when all storage media are composed of the SSDs 12 as with the storage apparatus 10 according to this embodiment, the same type of storage media are used, so it seems to be normally unnecessary to perform the hierarchical control. However, even though the same SSDs 12 are used, their performance and property (the property will be explained later) vary depending on their type as described later. Furthermore, the performance of the SSDs 12 not only degrades after the elapse of certain use time, but also recovers by executing specified processing. In other words, the performance of the SSDs 12 changes along with the elapse of time.

Performing the hierarchical control by making use of the characteristic of the SSDs 12 that their performance changes is the characteristic configuration of the storage apparatus 10 according to this embodiment. Then, this embodiment is intended to prevent I/O performance degradation and extend the life by executing the hierarchical control based on the variable performance of the SSDs 12.

Regarding the plurality of SSDs 12, the same type of drives form a RAID (Redundant Array Independent Disks) group. RAID groups, each of which is composed of the same type of drives, provide the controller 11 with storage areas of different performances. The storage areas of different performances, which are provided to the controller 11, are classified into a plurality of tiers and managed by means of the aforementioned hierarchical control.

The "same type of drives" which is the requirement for the configuration of a RAID group means, for example, SSDs of the same vendor, the same generation, and the same cell structure (SLC, MLC, or TLC) and SSDs with common specifications and performance. Generally, an SSD has the following four characteristic properties: the SSD's performance changes depending on a data retaining rate; as the SSD continues to be used, its performance degrades; the SSD has a limitation on the number of writes (it has a limited life); and once a specified condition is satisfied, the SSD's performance recovers.

Specifically speaking, the performance of the SSD degrades based on the data retaining rate as mentioned above and the performance changes by executing reclamation which is garbage collection processing. Furthermore, when the number of writes of internal cells becomes close to a limited number of writes, the performance degrades and the limited number of writes is a rewrite life. Furthermore, the performance of some SSD recovers by executing sequential writing or suppressing inputs and outputs for a certain period of time. Particularly, this property of performance recovery is the property that HDDs (Hard Disk Drives) do not have.

These properties are common to SSDs in general; however, the properties vary depending on the type of SSDs among the same SSDs as in a case, for example, where the performance of SSD 1 of vendor A recovers by 10% by suppressing inputs and outputs for a certain period of time and the performance of SSD 2 of vendor B recovers by 60% by executing sequential writing. In this specification, SSDs of different vendors, generations, or cell structures are treated as drives with different properties because they have common general properties of SSDs, but their individual (or partial) properties are different.

Therefore, the plurality of SSDs 12 provide the controller with storage areas of different performances as explained earlier. The storage areas of different performances, that is, different types of SSDs 12 are classified according to the respective performances into, and managed as, for example, tier H (High) for high performance, tier M (Mid) for medium performance, and tier L (Low) for low performance. Then, regarding the SSD 12 which is classified, for example, into tier M at the beginning, the tier is changed to make the SSD 12 belong to tier L when its performance degrades; and when its performance recovers, the tier is change to make the SSD 12 belong to tier M again. Furthermore, a read-only archive tier A (Archive) may be provided in addition to the tiers mentioned above. This tier is composed of SSDs 12 which are very close to the end of their rewrite life. Once the SSDs 12 are moved to this tier, the tier will not be changed.

Therefore, with the storage apparatus 10 whose all storage media are composed of SSDs 12 according to this embodiment, storage areas provided by the SSDs 12 are classified based on the performance and the property of the SSDs 12 and the tier, to which the SSDs 12 belong, is changed based on the variable performance of the SSDs 12, so that it is possible to prevent degradation of I/O performance.

(1-2) Internal Configuration

Figure 2:
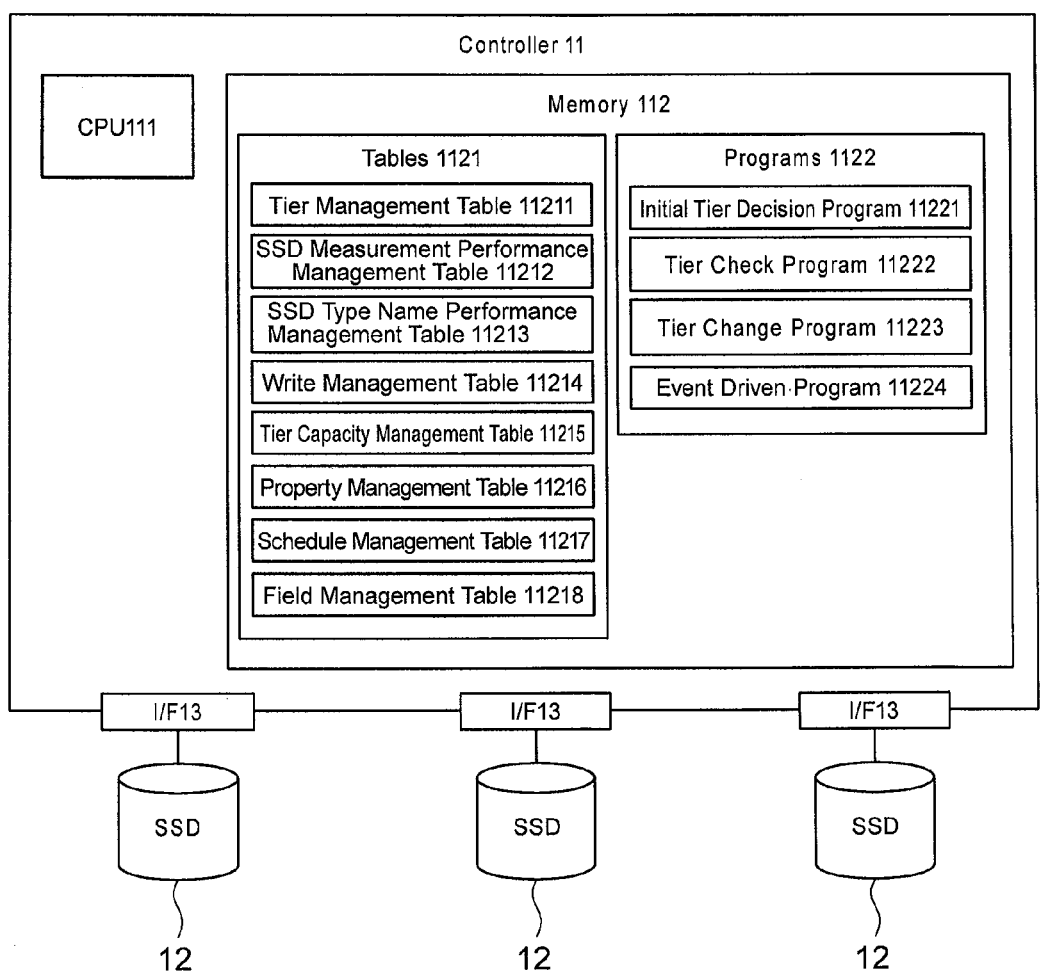
FIG. 2 is an internal configuration diagram of a controller.

FIG. 2 shows an internal configuration of the controller 11. The controller 11 is configured by including a CPU (Central Processing Unit) 111 and a memory 112. Also, the controller 11 and the SSDs 12 are connected via an I/F 13. Incidentally, the I/F 13 is normally provided with a repeater such as a SAS expander although it is not illustrated in the drawing.

The CPU 111 is a processor for controlling the entire operation of the controller 11 in a supervisory manner in cooperation with various tables 1121 and various programs 1122 stored in the memory 112.

The memory 112 is configured by storing the various tables 1121 and the various programs 1122. The various tables 1121 are a tier management table 11211, an SSD measurement performance management table 11212, an SSD type name performance management table 11213, a write management table 11214, a tier capacity management table 11215, a property management table 11216, a schedule management table 11217, and a field management table 11218. The details of these various tables 1121 will be explained later (FIG. 3 to FIG. 10).

Moreover, the various programs 1122 are an initial tier decision program 11221, a tier check program 11222, a tier change program 11223, and an event driven program 11224. The details of processing executed by these various programs 1122 under the control of the CPU 1121 will be explained later (FIG. 13 to FIG. 30).

(1-3) Detailed Configuration

FIG. 3 illustrates a logical configuration of the tier management table 11211. The tier management table 11211 is a table for managing the SSDs 12 and tiers to which the SSDs 12 belong and is constituted from an SSD number column 112111 and a tier column 112112.

The SSD number column 112111 stores an identification number of the relevant SSD 12. Moreover, the tier column 112112 stores a tier division classified by the performance.

Therefore, in the case of FIG. 3, it is shown that, for example, an SSD 12 whose SSD number is "SSD 1" belongs to a tier called "tier H." Incidentally, tier H in this example is a tier of the highest-level response performance, tier M is a tier of medium-level response performance, and tier L is a tier of the lowest-level response performance.

FIG. 4 illustrates a logical configuration of the SSD measurement performance management table 11212. The SSD measurement performance management table 11212 is a table for managing the performance of the SSDs 12 based on actual measurement and is constituted from an SSD number column 112121, a performance value column 112122, and a rank order column 112123.

The SSD number column 112121 stores an identification number of the relevant SSD 12. The performance value column 112122 stores an IOPS value in this example. Moreover, the rank order column 112123 stores the performance rank order.

Therefore, in the case of FIG. 4, it is shown that, for example, the IOPS value of the SSD 12 whose SSD number is "SSD 1" is "5000" and its performance rank order is the "$2^{nd}$."

FIG. 5 illustrates a logical configuration of the SSD type name performance management table 11213. The SSD type name performance management table 11213 is a table for managing theoretically initial performance of the SSDs 12 based on an SSD type name and is constituted from an SSD type name column 112131 and a performance value column 112132.

The SSD type name column 112131 stores an SSD type name that is predefined by the vendor. Moreover, the performance value column 112132 stores an IOPS value in this example.

Therefore, in the case of FIG. 5, it is shown that, for example, the IOPS value of the SSD 12 whose SSD type name is "ABC," as its theoretically initial performance is "1000."

FIG. 6 illustrates a logical configuration of the write management table 11214. The write management table 11214 is a table for managing writing of data to the SSDs 12 and is constituted from an SSD number column 112141, a number-of-writes column 112142, a write capacity column 112143, and an operation time column 112144.

The SSD number column 112141 stores an identification number of the relevant SSD 12. The number-of-writes column 112142 stores the number of writes (accumulated number of times). The write capacity column 112143 stores a write capacity (accumulated capacity). The operation time column 112144 stores operation time of the relevant SSD 12.

Therefore, in the case of FIG. 6, it is shown that, for example, regarding the SSD 12 whose SSD number is "SSD 1," the number of writes is "10000" times, the write capacity is "5 GB," and the operation time is "HH:MM:SS."

FIG. 7 shows a logical configuration of the tier capacity management table 11215. The tier capacity management table 11215 is a table for managing the capacity of each tier and is constituted from a tier column 112151, a total capacity column 112152, and an unused capacity column 112153.

The tier column 112151 stores a tier division classified by the response performance. The total capacity column 112152 stores a total capacity of the relevant tier. The unused capacity column 112153 stores an unused capacity of the relevant tier.

Therefore, in the case of FIG. 7, it is shown that, for example, regarding the tier called "tier H," the total capacity is "10000 GB" and the unused capacity is "8000 GB." Incidentally, a consumed capacity can be found by subtracting the unused capacity from the total capacity. The consumed capacity of the relevant tier in this case is 10000 GB−8000 GB=2000 GB.

FIG. 8 illustrates a logical configuration of the property management table 11216. The property management table 11216 is a table for managing each property of the SSDs 12 obtained based on previous load evaluation and is constituted from a vendor name column 112161, a model type column 112162, a life column 112163, a performance column 112164, a performance degradation degree column 112165, a recovery method column 112166, and a recovery capability column 112167.

The vendor name column 112161 stores a vendor name of the SSDs 12. The model type column 112162 stores a model type such as a high performance model or an inexpensive model. Incidentally, this column may store an identification name such as a product type name or a part number. The columns from the life column 112163 to the recovery capability column 112167 store parameters parameter (such as long, short, high-speed, low-speed, high, low, or numerical information) or a recovery method with respect to each property.

Specifically speaking, the life column 112163 stores a parameter for the life of the SSDs 12 attributable to the limited number of writes. The performance column 112164 stores a parameter indicative of an I/O processing speed in relation to the IOPS or the response time.

The performance degradation degree column 112165 stores a parameter indicative of the degree of performance degradation. The recovery method column 112166 stores information indicative of a performance recovery method. The recovery capability column 112167 stores a parameter indicative of performance recovery capability.

Therefore, in the case of FIG. 8, it is shown that, for example, the SSDs 12 whose vendor name is "vendor A" and whose model type is "high performance model" are managed as those having the property of "long" life, "high-speed" performance, and "high" performance degradation degree. Moreover, these SSDs 12 are managed as those having the property capable of recovering by executing "sequential writing," and having "high" recovery capability.

FIG. 9 shows a logical configuration example of the schedule management table 11217. The schedule management table 11217 is a table for managing a tier location policy and tier change schedule according to each parameter of each property of the SSDs 12 and is constituted from an item column 112171, a parameter column 112172, and a schedule column 112173.

The item column 112171 stores a property division of the SSDs 12. The property stored in this item column 112171 corresponds to the property of each column from the life column 112163 to the recovery capability column 112167 in the property management table 11216 in FIG. 8. Moreover, the parameter column 112172 stores a parameter type of each property. The parameter type shown in this example is a separate definition for classifying a value based on, for example, specifications of the SSDs 12, actual measurement data, and statistic information in the field (into arbitrary groups). Moreover, the schedule column 112173 stores, for example, a schedule of tier changes.

Therefore, in the case of FIG. 9, it is shown that, for example, regarding the properties of the SSDs 12, "long" or "short" are prepared as parameters for the "life"; and in a case of the SSDs 12 belonging to the "long" life, "lower the tier rank 12 months later" is indicated as the schedule for the tier for which the relevant SSDs 12 belong.

Furthermore, for example, it is shown that regarding the "performance" among the properties of the SSDs 12, "high-speed," "medium-speed," and "low-speed" are prepared as parameters; and in a case of the SSDs 12 belonging to the "high-speed" division of the performance, the tier to which the SSDs 12 belong is scheduled to be "located in a high-rank tier upon initial installment.".

Therefore, referring to FIG. 9 together with FIG. 8, the SSDs 12 of "vendor A" and "high performance model" has the "long" life and "high-speed" performance. Therefore, these SSDs 12 are "located in a high-rank tier" upon the initial installment and are scheduled to "lower the tier rank 12 months later."

FIG. 10 illustrates a logical configuration of the field management table 11218. The field management table 11218 is a table for managing a tier change schedule based on the field information and is constituted from an SSD type name column 112181, an elapsed time period column 112182, a field performance column 112183, and a tier location schedule column 112184.

The SSD type name column 112181 stores an SSD type name which is predefined by the vendor. The elapsed time period column 112182 stores information indicative of month or year in the order of time elapse. The field performance column 112183 stores a division found from a statistic average value (field performance) of the performance actually exhibited by SSDs of the same type name as that of the SSD type name column 112181 for each elapsed time period. The tier location schedule column 112184 stores a schedule for a tier to which the SSDs 12 should belong, for each month elapsed after the initial installment.

Incidentally, the field performance stored in the field performance column 112183 is obtained by cumulatively aggregating performance data, including data collected in the past, about the performance actually exhibited in the field by SSDs of the same type name as that of the SSD type name column 112181 as described above and calculating an average value of the aggregated performances.

Furthermore, the field performance may be calculated, for example, simply from the SSDs of the same type name as mentioned above or may be calculated from SSDs having the same type name and the same configuration, that is, the same controller type and the same number of mounted SSDs. Moreover, the field performance may be calculated from SSDs having the same type name and the same degree of performance as obtained as actual measured value at the time of the initial installment of the SSDs 12.

Therefore, in the case of FIG. 10, it is shown that, for example, the SSD 12 whose SSD type name is "ABC" is scheduled to belong to "tier H" of high performance based on the field performance indicating that when SSDs 12 of the same type name were actually mounted in the storage apparatus 10 in the past, their field performance was "high" "1 month" and "2 months" after the installation.

Furthermore, it is shown that this SSD 12 is scheduled to belong to "tier M" of medium performance, "tier L" of low performance, and then "tier H" of high performance based on the field performance of the SSDs 12 having the same type name, which then changed to "medium," "low," and "high." Furthermore, it is shown that the SSD 12 is scheduled to: change the tier to belong to "tier L" in "N year(s)" and issue a replacement request based on the field information that the field performance reached the "end of life" when the elapsed time period became "N year(s)."

(1-4) Relationship Between SSD's Performance Change and Tier to Belong

Figure 11:
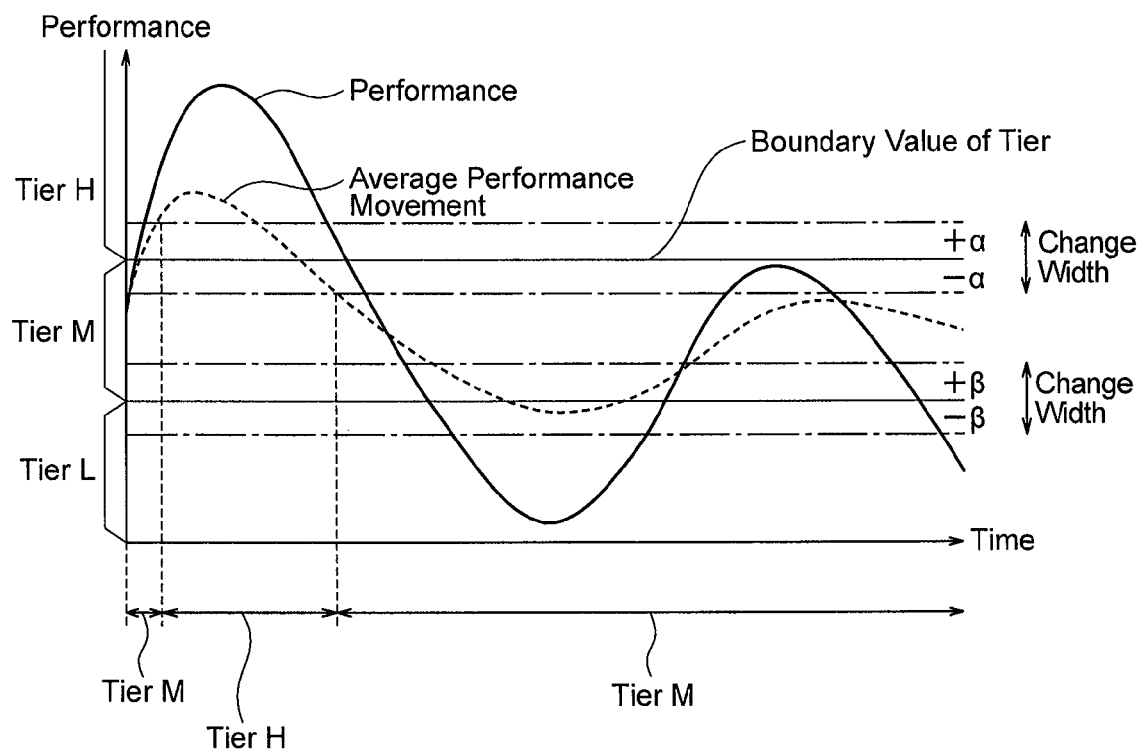
FIG. 11 is a conceptual diagram showing the relationship between variable performances of SSDs and tiers to which they belong.

FIG. 11 shows the relationship between the performance of the SSDs 12, which changes along with the elapse of time, and the tier to which the SSDs 12 belong. The horizontal axis represents time and the vertical axis represents performance. Moreover, a solid curved line represents the performance of the SSDs 12, which changes along with the elapse of time, while a broken curved line represents a moving average of the performance of the SSDs 12. Furthermore, each solid straight line parallel to the horizontal axis represents a tier boundary value and broken straight lines parallel to the horizontal axis represent an upper limit value and lower limit value of the change width.

The tier boundary value is decided by calculating an average value of the performance of the SSDs 12 belonging to each tier and calculating a median value of the average values of the adjacent tiers. The change width is decided based on the upper limit value and the lower limit value of the performance predetermined based on the tier boundary values.

In this embodiment, a change of the tier to which the SSDs 12 belong is decided when the moving average of the performance of the SSDs 12 exceeds, or can be predicted to exceed, the upper limit value or the lower limit value of the change width. Incidentally, if the moving average value of any one of SSDs 12 among a plurality of SSDs 12 constituting the same RAID group exceeds the upper limit value or the lower limit of the change width, the moving average of other SSDs 12 constituting the same RAID group can be predicted to also exceed the upper limit value or the lower limit of the change width.

The reason why the tier change is decided based on the moving average, not on the performance of the SSD 12, is to avoid frequent changes of the tier due to an sudden increase or decrease of the performance of the SSD 12.

Similarly, the reason why the tier change is decided based on not the tier boundary value, but on the upper limit value or the lower limit value of the change width as a threshold value by checking if the performance exceeds this threshold value or not is to avoid frequent changes of the tier when the performance of the SSD 12 changes up and down near the tier boundary value.

Therefore, in the case of FIG. 11, it is shown that when the moving average of the performance of the SSD 12 belonging to tier M at the time of the initial installment increases along with the elapse of time and exceeds the upper limit value of the change width, that is, +α plus the tier boundary value between tier M and tier H, the tier to which the relevant SSD 12 belongs is changed from tier M to tier H.

It is also shown that when the moving average of the performance of the SSD 12 decreases along with the elapse of time and falls below the lower limit value of the change width, that is, −α below the tier boundary value between tier H and tier M, the tier to which this SSD 12 belong is changed from tier H to tier M.

Subsequently, the moving average of the performance of this SSD 12 does not increase in excess of the upper limit value of the change width and remains without falling down below the lower limit value, so that the tier to which this SSD 12 belong is not changed and remains to be tier M.

Figure 12:
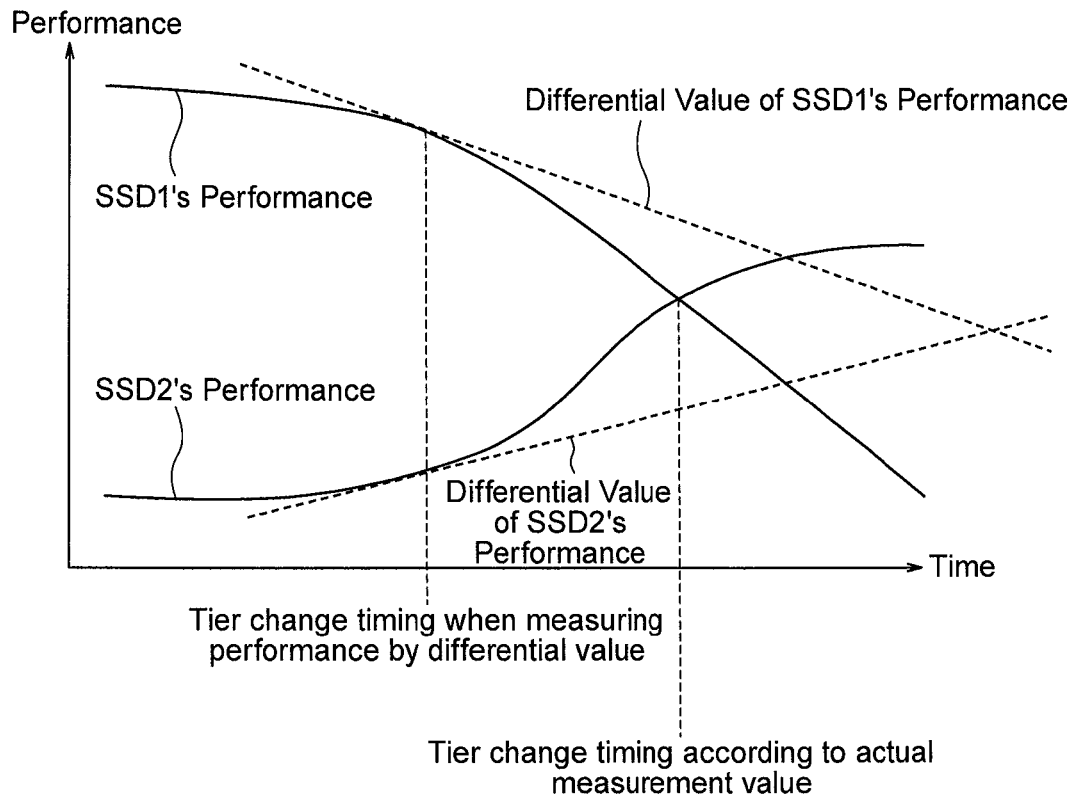
FIG. 12 is a conceptual diagram showing a state in which the variable performances of SSDs change inversely.

FIG. 12 shows a state where the performances of two SSDs 12 change inversely along with the elapse of time. Similarly to FIG. 11, the horizontal axis represents time and the vertical axis represents performance. Furthermore, a solid curved line represents the performance of each SSD 12, which changes along with the elapse of time, while a broken straight line having a point of tangency with the solid line represents a differential value of the performance of the SSD 12 at a certain point in time.

In this embodiment, a change of the tier to which an SSD 12 belongs is decided when the performance of the target SSD 12 changes, or can be predicted to change, inversely with the performance of another SSD 12 belonging to another tier. Incidentally, when a differential value of the performance of the target SSD 12 at a certain point in time changes inversely with the performance of another SSD 12 belonging to another tier within a certain amount of time, the performances can be predicted to change inversely.

Therefore, in the case of FIG. 12, when the performance of "SSD 1" which belongs to, for example, tier H of high performance at the time of initial installment and has the lowest performance among the SSDs 12 belonging to tier H and the performance of "SSD 2" which belongs to, for example, tier L of low performance at the time of initial installment and has the highest performance among the SSDs 12 belonging to tier L change inversely along with the elapse of time, the tier to which "SSD 1" belongs and the tier to which "SSD 2" belongs are changed at the timing when the performances change inversely.

Furthermore, when the performance of "SSD 1" and the performance of "SSD 2" can be predicted to change inversely with each other at certain point in time based on the differential value of the performance of "SSD 1" and the differential value of the performance of "SSD 2" at a certain point in time, the tier to which "SSD 1" belongs and the tier to which "SSD 2" belongs are changed at the timing when the performances are predicted to change inversely.

(1-5) Flowcharts

Figure 13:
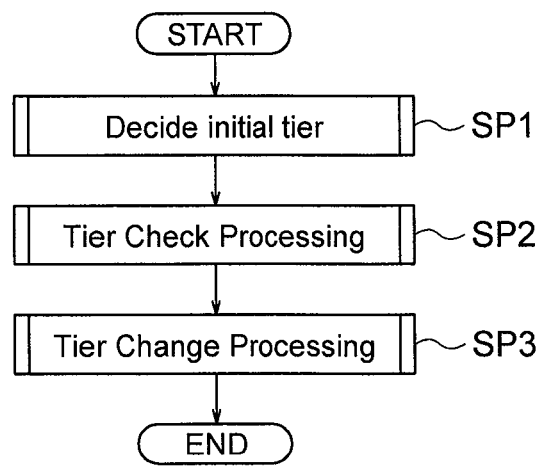
FIG. 13 is a flowchart illustrating a flow of entire hierarchical control processing.

FIG. 13 illustrates a processing sequence for the hierarchical control processing. The hierarchical control processing explained below illustrates a flow of the entire processing and is executed as triggered by initial setting operation when starting the operation of the storage apparatus 10. This hierarchical control processing is executed by the CPU 111 in cooperation with the initial tier decision program 11221, the tier check program 11222, and the tier change program 11223.

Firstly, the CPU 111 reads the initial tier decision program 11221 as triggered by the initial setting operation. Then, the CPU 111 decides a tier to which each SSD 12 should belong (initial tier), in cooperation with the initial tier decision program 11221 which has been read (SP1).

Next, the CPU 111 reads the tier check program 11222 and always or periodically monitors the performance of each SSD 12, which changes along with the elapse of time. Then, in any SSD 12 whose variable performance exceeds a predetermined threshold value exists, the CPU 111 decides to change the tier to which the SSD 12 whose performance has exceeded the threshold value (SP2).

Incidentally, the threshold value herein used is, for example, the upper limit value or the lower limit value of the change width (FIG. 11) or is relative performance in relation to the SSDs 12 belonging to another tier (FIG. 12).

Then, the CPU 111 reads the tier change program 11223 and changes the tier to which the SSD 12 belongs and concerning which the change of the tier was decided in step SP2 (SP3), thereby terminating this processing. Incidentally, in a normal state, SP2 and SP3 are repeated periodically. When a new SSD 12 is installed, this processing is executed from SP1 on that SSD.

Figure 14:
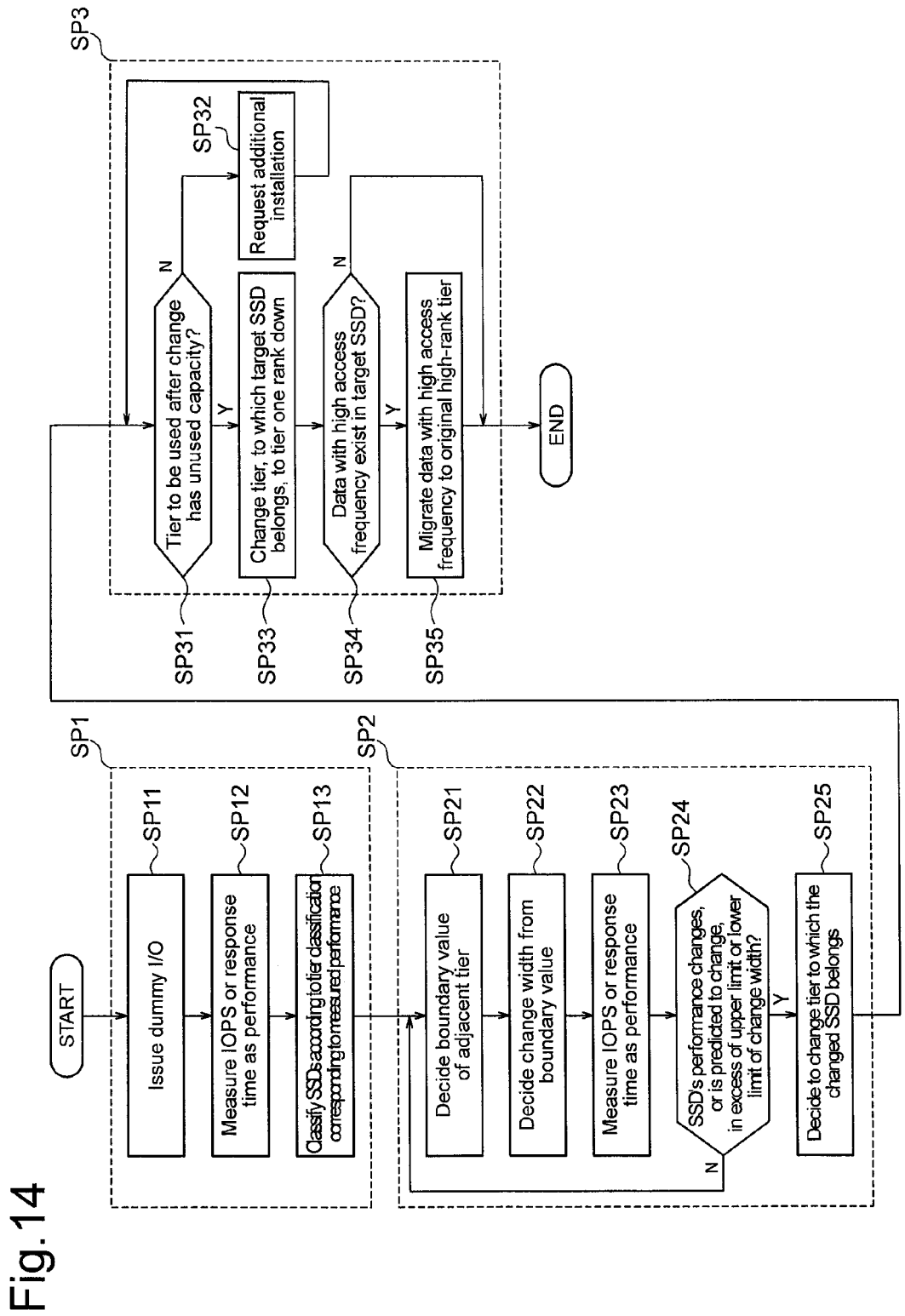
FIG. 14 is a flowchart illustrating the details of the hierarchical control processing.

FIG. 14 illustrates a detailed processing sequence for the hierarchical control processing. The hierarchical control processing illustrated in this drawing explains the details of the hierarchical control processing in FIG. 13.

Firstly, during the initial tier decision processing (SP1), the CPU 111 issues dummy I/O which does not involve data transfer, to the SSD 12s (SP11). Then, the CPU 111 measures laps or response time as the performance of the SSDs 12 (SP12). Subsequently, the CPU 111 classifies each SSD 12 to make it belong to a tier division corresponding to the measured performance (SP13), thereby terminating the initial tier decision processing. In SP13, specifically speaking, the CPU 111 stores information about the tier, to which each SD 12 belongs, in the tier column 112112 of the tier management table 11211 (FIG. 3).

Next, during the tier check processing (SP2), the CPU 111 aggregates the performances of all the SSDs 12 belonging to each tier, calculates an average value, sets this average value as the performance of each tier, and decides a median value of the performances of the adjacent tiers as a tier boundary value (SP21). Then, the CPU 111 decides the change width by setting the upper limit value and the lower limit value by adding or subtracting predetermined performance to or from the boundary value (SP22).

Subsequently, the CPU 111 always or periodically measures the IOPS or the response time of the SSD 12 as the performance (SP23). Incidentally, the CPU 111 manages the measured performance value by using the SSD measurement performance management table 11212 (FIG. 4). Next, the CPU 111 judges whether or not the measured performance of the SSD 12 has changed or is predicted to change in excess of the upper limit value or the lower limit value of the change width (SP24).

If the CPU 111 obtains a negative judgment result in step SP24, it proceeds to step SP21. On the other hand, if the CPU 111 obtains an affirmative judgment result in step SP 24, it decides to change the tier to belong for the SSD12 whose performance has changed in excess of the upper limit value or the lower limit value of the change width (SP25), thereby terminating the tier check processing.

Next, the tier change processing (SP3) will be explained. Now, the tier change processing in a case where the tier to which the SSD 12 belongs is changed from a higher-rank tier to a lower-rank tier will be explained. An assumed state in which the tier is changed from the higher-rank tier to the lower-rank tier can be a state where, for example, the performance of the SSD 12 has degraded or the SSD 12 is close to the end of its life.

Firstly, the CPU 111 refers to the tier capacity management table 11215 (FIG. 7) and judges whether the tier to be used after the change has an unused capacity or not (SP31). If the CPU 111 obtains a negative judgment result in step SP31, it requests additional installation of an SSD 12 having the performance corresponding to the tier division to be used after the change (SP32).

On the other hand, if the CPU 111 obtains an affirmative judgment result in step SP31, it changes the current tier for the SSD (target SSD) 12 to belong, concerning which the tier change was decided in step SP25, to a tier one rank down (SP33). Then, the CPU 111 judges whether or not data with high access frequency exist among data stored in the target SSD 12 (SP34).

If the CPU 111 obtains a negative judgment result in step SP 34, it terminates the tier change processing. On the other hand, if the CPU 111 obtains an affirmative judgment result in step SP34, it migrates the data with high access frequency, which are stored in the target SSD 12, to any one of the SSDs 12 belonging to the higher-rank tier which was used before the tier change (SP35), thereby terminating the tier change processing. Incidentally, the above-described processing is executed sequentially on all the SSDs 12 mounted in the storage apparatus 10.

FIG. 15 to FIG. 17 show processing sequences for initial tier decision processing by other means (methods). Other initial tier decision processing (1) to (3) explained below is processing corresponding to the initial tier decision processing (from SP11 to SP13) explained in FIG. 14 and is processing that can be executed instead of the initial tier decision processing (from SP11 to SP13).

Firstly, FIG. 15 will be explained. The CPU 111 acquires the SSD type name of the SSDs 12 mounted in the storage apparatus 10 (SP11A). Then, the CPU 111 refers to the SSD type name performance management table 11213 (FIG. 5) and classifies the SSDs 12 based on the performance corresponding to the acquired SSD type name (SP12A). Then, the CPU 111 decides an initial tier to which the relevant SSD 12 should belong, by allocating the tier to the SSDs in descending order of the performance (SP13A), thereby terminating this other initial tier decision processing (1).

Next, FIG. 16 will be explained. Since steps SP11B and SP12B are the same processing as steps SP11 and SP12 of the initial tier decision processing (SP1), an explanation about them has been omitted. The CPU 111 decides the initial tier to which the relevant SSD should belong, by allocating the tier to the SSDs 12 as many as a predetermined number of SSDs 12 required for each tier in descending order of the performance in step SP13B (SP13B), thereby terminating this other initial tier decision processing (2).

Next, FIG. 17 will be explained. The CPU 111 decides the initial tier to which the relevant SSD 12 should belong, by setting the tier, to which all the SSDs 12 mounted in the storage apparatus 10 should belong, as tier M whose performance is "medium" (SP11C), thereby terminating this other initial tier decision processing (3).

Figure 18:
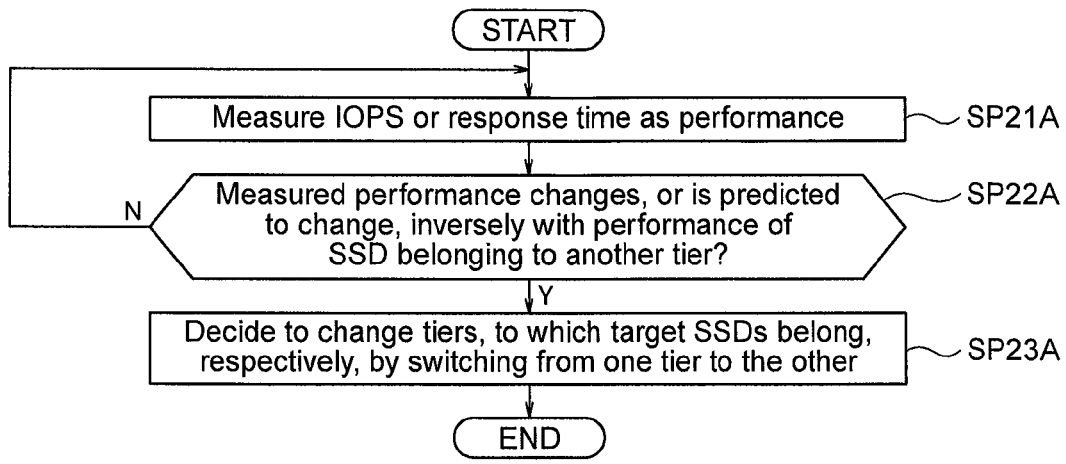
FIG. 18 is a flowchart illustrating another tier check processing.
Figure 19:
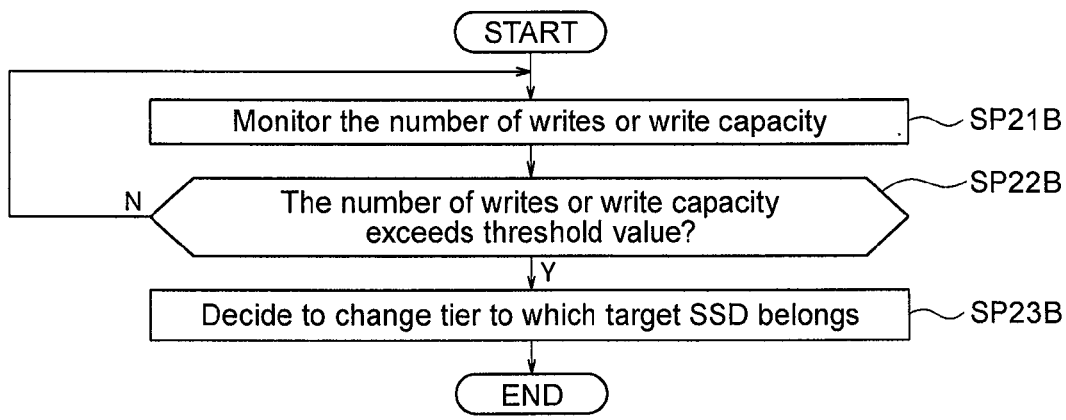
FIG. 19 is a flowchart illustrating another tier check processing.
Figure 20:
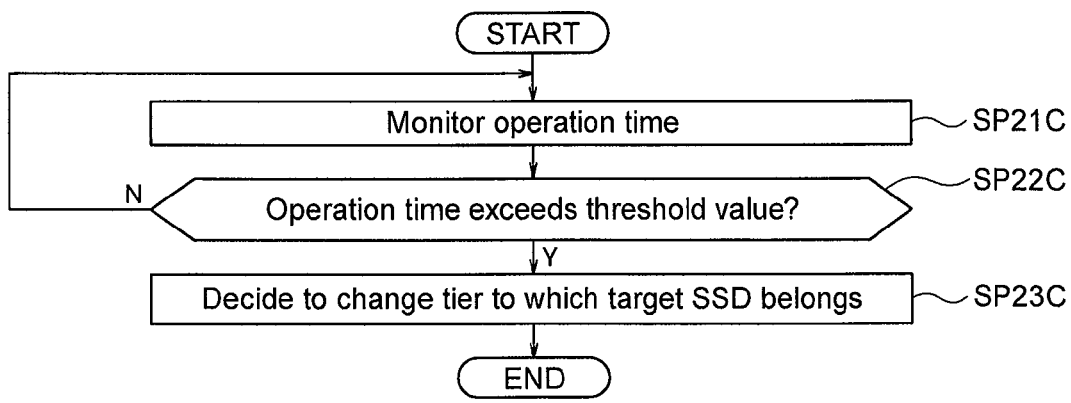
FIG. 20 is a flowchart illustrating another tier check processing.

FIG. 18 to FIG. 20 illustrate processing sequences of another tier check processing (1) to (3). Another tier check processing illustrated here is processing corresponding to the tier check processing (from SP21 to SP25) explained in FIG. 14 and is the processing that can be executed instead of the tier check processing (from SP21 to SP25).

Firstly, FIG. 18 will be explained. The CPU 111 measures the IOPS or the response time of the SSDs 12 mounted in the storage apparatus 10 as their performance (SP21A). Then, the CPU 111 extracts any one SSD from the plurality of SSDs 12 and judges whether or not the performance of the extracted SSD 12 changes or is predicted to change inversely with the performance of another SSD 12 belonging to another tier (SP22A).

If the CPU 111 obtains a negative judgment result in step SP22A, it proceeds to step SP21A and performs the next performance measurement of the same SSD 12 or executes the same processing on another SSD 12. On the other hand, if the CPU 111 obtains an affirmative judgment result in step SP22A, it decides to change the tiers for the SSDs (target SSDs) 12 which were judgment targets in step SP22A (SP23A) by switching from one tier to the other, thereby terminating this other tier check processing (1).

Next, FIG. 19 will be explained. The CPU 111 monitors the number of writes or write capacity with respect to the SSDs 12 (SP21B) and manages the number of writes or the write capacity by using the write management table 11214 (FIG. 6). Then, the CPU 111 judges whether the number of writes or the write capacity exceeds a predetermined threshold value or not (SP22B).

If the CPU 111 obtains a negative judgment result in step SP22B, it proceeds to step SP21B and performs the next judgment of the number of writes or the write capacity with respect to the same SSD 12 or executes the same processing on another SSD 12. On the other hand, if the CPU 111 obtains an affirmative judgment result in step SP22B, it decides to change the tier for the SSD (target SSD) 12 which was the judgment target in step SP22B (SP23B), thereby terminating this other tier check processing (2).

Next, FIG. 20 will be explained. the CPU 111 monitors operation time with respect to the SSDs 12 (SP21C) and manages the operation time by using the write management table 11214 (FIG. 6). Then, the CPU 111 judges whether the operation time exceeds a predetermined threshold value or not (SP22C).

If the CPU 111 obtains a negative judgment result in step SP22C, it proceeds to step SP21C and performs the next operation time judgment on the same SSD 12 or executes the same processing on another SSD 12. On the other hand, if the CPU 111 obtains an affirmative judgment result in step SP22C, it decides to change the tier to belong for the SSD (target SSD) 12 which was the judgment target in step SP22C (SP23C), thereby terminating this other tier check processing (3).

Figure 21:
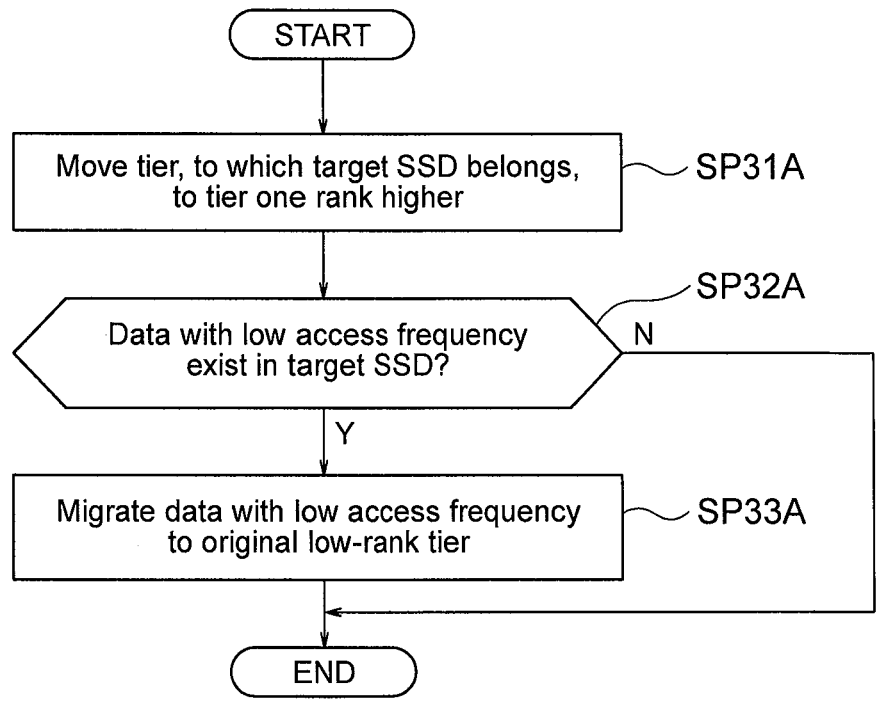
FIG. 21 is a flowchart illustrating another tier change processing.

FIG. 21 illustrates a processing sequence for another tier change processing. Another tier change processing illustrated here is processing corresponding to the tier change processing (from SP31 to SP35) explained in FIG. 14 and is the processing that can be executed instead of the tier change processing (from SP31 to SP35). Furthermore, this other tier change processing is processing executed when the tier to which the SSD 12 belongs is changed from a lower-rank tier to a higher-rank tier. An assumed state where the tier is changed from the lower-rank tier to the higher-rank tier can be a state where the performance of the relevant SSD 12 has recovered.

Firstly, the CPU 111 changes the current tier to belong for the SSD (target SSD) 12, concerning which the tier change was decided as a result of the tier check processing (SP2), to a tier one rank higher (SP31A). Then, the CPU 111 judges whether or not data with low access frequency exist among data stored in the target SSD 12 (SP32A).

If the CPU 111 obtains a negative judgment result in step SP32A, it terminates this other tier change processing. On the other hand, if the CPU 111 obtains an affirmative judgment result in step SP32A, it migrates the data with low access frequency, which are stored in the target SSD 12, to any one of the SSDs 12 belonging to the low-rank tier which has been used before the tier change (SP33A), thereby terminating this other tier change processing. Incidentally, the invention is not limited to this example and the processing in SP32A and SP33A may not be executed. In this case, the data with low access frequency, which are stored in the relevant SSD 12, will be migrated to the lower-rank tier at the timing of execution of normal inter-tier data migration processing. Furthermore, the processing corresponding to SP31 in FIG. 14 is unnecessary. If the lower-rank tier lacks unused capacity, the data with low access frequency will remain in the higher-rank tier without being migrated or only part of the data equivalent to the unused capacity will be migrated.

(1-6) Advantageous Effects of First Embodiment

The storage apparatus according to the first embodiment described above is designed so that all the storage media mounted therein are composed of SSDs and the hierarchical control is performed by managing storage areas provided by the SSDs by classifying them into a plurality of tiers based on the difference of the SSDs' properties, the difference of the SSDs' performances, and/or the performance which varies depending on the SSDs. So, it is possible to minimize degradation of the SSDs' I/O processing performance which is originally a higher speed that that of HDDs.

(2) Second Embodiment

The difference between a second embodiment and the first embodiment is that scheduling processing is executed, instead of the tier check processing (SP2), in the second embodiment. Regarding a storage apparatus and tier control method according to the second embodiment, the same reference numeral as that used in the first embodiment will be assigned to the same component as that used in the first embodiment and an explanation about it has been omitted; and components different from those used in the first embodiment will be explained below.

(2-1) Flowcharts

Figure 22:
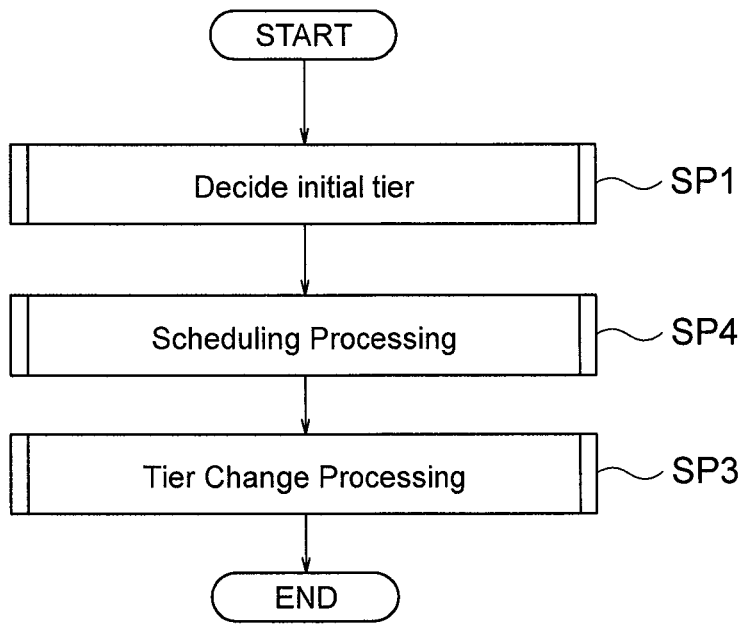
FIG. 22 is a flowchart illustrating an entire flow of second hierarchical control processing.

FIG. 22 illustrates a processing sequence for second hierarchical control processing. The second hierarchical control processing illustrated here is processing corresponding to the hierarchical control processing (FIG. 13) in the first embodiment and scheduling processing (SP4) is executed instead of the tier check processing (SP2).

The scheduling processing (SP4) is processing executed by the CPU 111 in cooperation with the tier check program 11222 and is processing for deciding to change the tier to which the individual SSD 12 belongs, according to a predetermined schedule.

Figure 23:
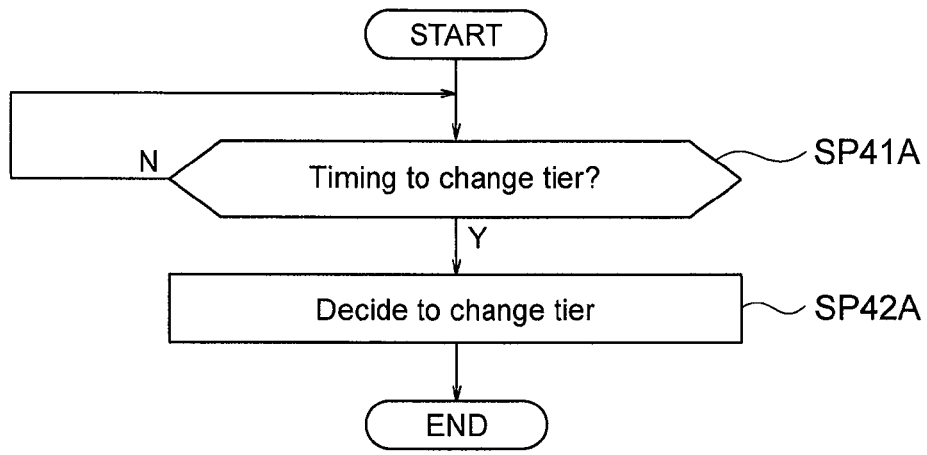
FIG. 23 is a flowchart illustrating the scheduling processing.

FIG. 23 illustrates a detailed processing sequence for the scheduling processing. The scheduling processing illustrated here describes the details of the scheduling processing in FIG. 22.

Firstly, the CPU 111 manages the property management table 11216 (FIG. 8) and the schedule management table 11217 (FIG. 9) in advance and decides the timing to change the tier for the relevant SSD 12 by referring to the property management table 11216 and the schedule management table 11217. Then, the CPU 111 judges whether the decided timing to change the tier for the SSD 12 has come or not (SP41A).

If the CPU 111 obtains a negative judgment result in step SP41A, it repeats the judgment in step SP41A. On the other hand, if the CPU 111 obtains an affirmative judgment result in step SP41A, it decides to change the tier to belong for the SSD (target SSD) 12 which was the judgment target in step SP41A (SP42A), thereby terminating the scheduling processing.

Figure 24:
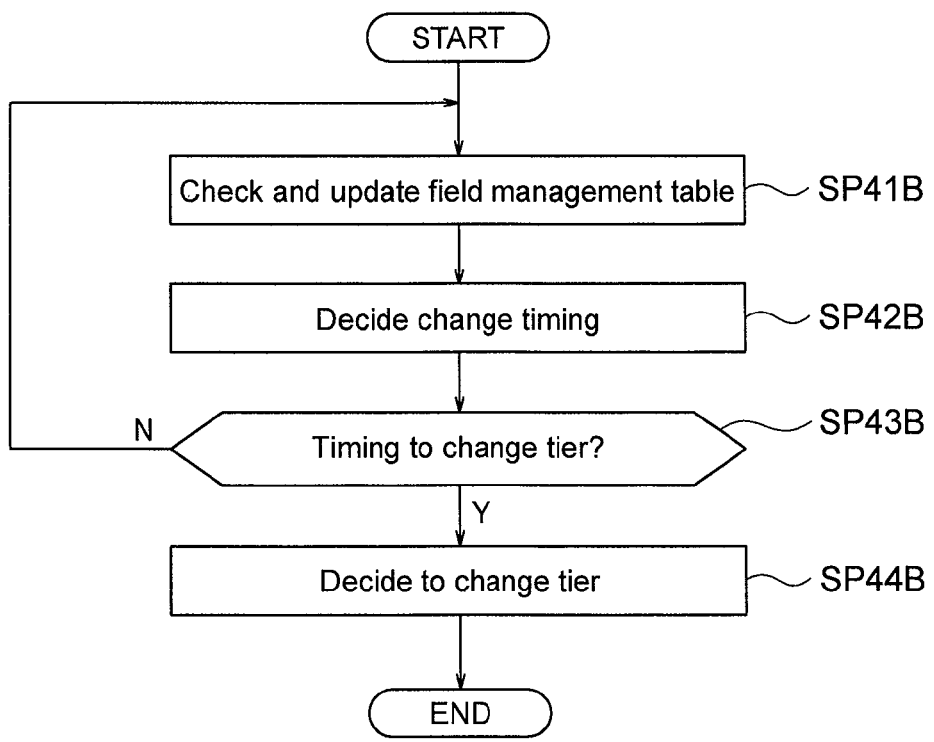
FIG. 24 is a flowchart illustrating another scheduling processing.

FIG. 24 illustrates a detailed processing sequence for another scheduling processing. Another scheduling processing illustrated here describes the details of the scheduling processing SP4 in FIG. 22 and is processing that can be executed instead of the scheduling processing (SP41A and SP42A) in FIG. 23.

Firstly, the CPU 111 checks and updates the field management table 11218 with respect to information, which is a source for the field management table based on monitoring of the field status, by means of input by an operation or input from a network or the like (SP41B), thereby managing the field management table 11218 (FIG. 10). Specifically speaking, the CPU 111 manages the field performance in the field management table 11218 corresponding to the operation time of the SSDs 12.

Then, the CPU 111 decides the timing to change the tier to which the individual SSD 12 belongs, by referring to the field management table 11218 with respect to the tier location schedule decided based on the field performance (SP42B).

Next, the CPU 111 judges whether the timing, which was calculated in SP42B, to change the tier to which the SSD 12 belongs has come or not (SP43B). If the CPU 111 obtains a negative judgment result in step SP43B, it proceeds to step SP41B.

On the other hand, if the CPU 111 obtains an affirmative judgment result in step SP43B, it decides to change the tier to belong for the SSD (target SSD) 12 which was the judgment target in step SP43B (SP44B), thereby terminating this other scheduling processing.

(2-2) Advantageous Effects of Second Embodiment

The storage apparatus according to the second embodiment described above is designed to change the tier, to which the relevant SSD belongs, at predetermined tier change timing, so that the hierarchical control processing can be simplified and a CPU processing burden on the hierarchical control can be reduced. Furthermore, another advantage is that more precise control can be performed because not specification information described in, for example, catalogues of SSDs, but data for practical operation are fed back.

(3) Third Embodiment

The difference between a third embodiment and the first embodiment is that event driven processing is executed in the third embodiment when an SSD 12 is close to the end of its life, an SSD 12 is additionally installed, or an SSD 12 is removed. Regarding a storage apparatus and tier control method according to the third embodiment, the same reference numeral as that used in the first embodiment will be assigned to the same component as that used in the first embodiment and an explanation about it has been omitted; and components different from those used in the first embodiment will be explained below.

(3-1) Flowcharts

Figure 25:
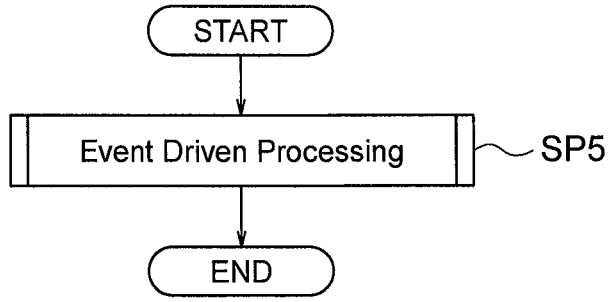
FIG. 25 is a flowchart illustrating an entire flow of event driven processing.

FIG. 25 illustrates a processing sequence for the event driven processing. The event driven processing illustrated here shows a flow of the entire processing and is executed as triggered by timing when any of SSDs 12 mounted in the storage apparatus 10 is close to the end of its life, when an SSD 12 is additionally installed, or when an SSD 12 is removed. This event driven processing is executed by the CPU 111 in cooperation with the event driven program 11224.

Firstly, when the CPU 111 detects that the SSD 12 is close to the end of its life, an SSD 12 is to be additionally installed, or an SSD 12 is to be removed, it reads the event driven program 11224. Then, the CPU 111 executes the event driven processing in cooperation with the event driven program 11224 which has been read (SP5).

Figure 26:
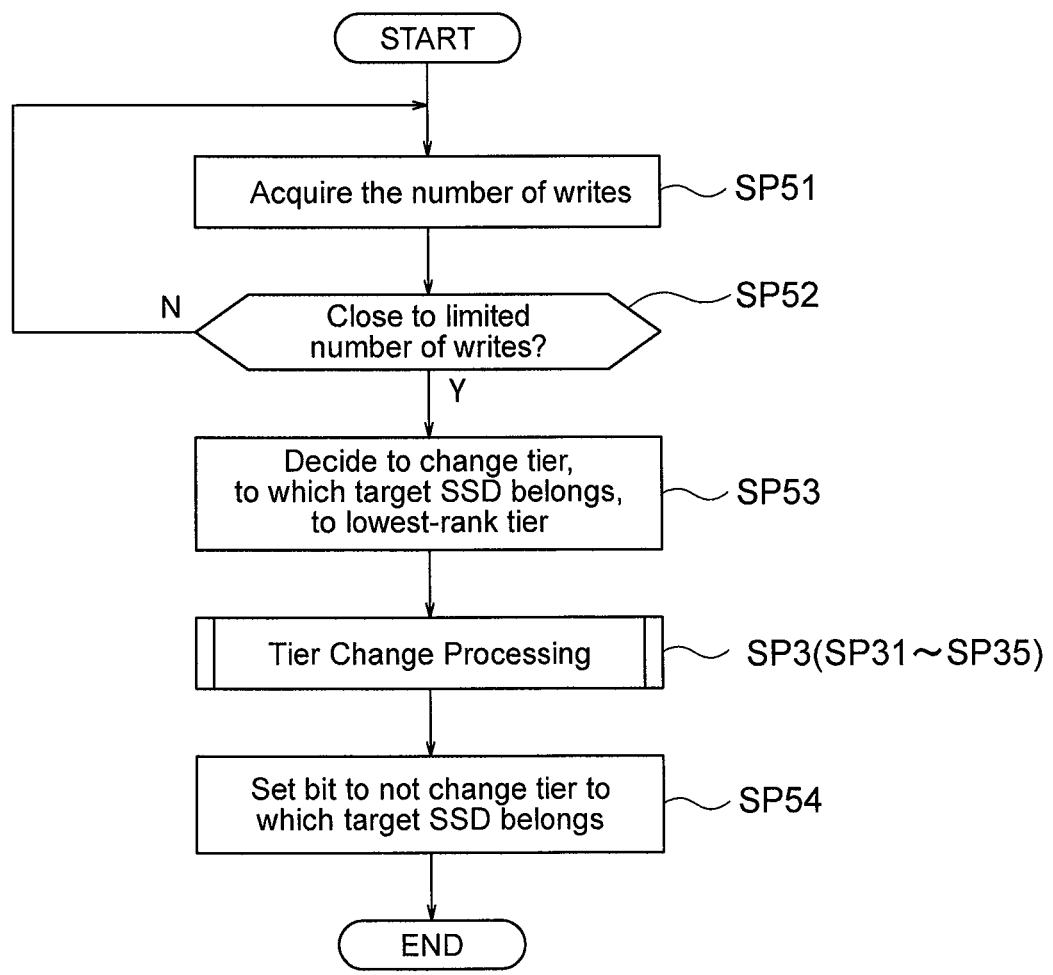
FIG. 26 is a flowchart illustrating the event driven processing.

FIG. 26 illustrates a processing sequence for the event driven processing executed at the timing when the SSD is close to the end of its life. Firstly, the CPU 111 acquires the number of writes of the individual SSDs 12 (SP51).

Incidentally, the number of writes is managed by the relevant SSD 12. For example, once the CPU 111 issues a command called MODE SENSE to the SSD 12, the SSD 12 reports a value indicating the "current number of writes"/ "limited number of writes" to the CPU 111. For example, if the value reported from the SSD 12 is "85," it means that data are currently written up to 85% of the limited number of writes.

Next, the CPU 111 judges whether the acquired number of writes is close to the limited number of writes or not (SP52). Incidentally, when the acquired number of writes exceeds a predetermined threshold value, the CPU 111 determines that the acquired number of writes is close to the limited number of writes.

If the CPU 111 obtains a negative judgment result in step SP52, it proceeds to step SP51. On the other hand, if the CPU 111 obtains an affirmative judgment result in step SP52, it decides to change the tier to belong for the SSD (target SSD) 12, which was the judgment target in step SP52, to a lowest-rank tier (SP53).

Then, the CPU 111 changes the tier, to which the target SSD 12 belongs, to the lowest-rank tier by executing the tier change processing (from SP31 to SP35). Since the target SSD 12 whose tier has been changed is close to the end of its life even if its performance should recover in the future; and, therefore, it is desirable that the tier for the target SSD 12 should not be changed to a higher-rank tier.

Accordingly, the CPU 111 sets a bit to not change the tier to which the target SSD 12 belongs (SP54), and also issues a message to prompt additional installment of an SSD 12, thereby terminating the event driven processing.

Figure 27:
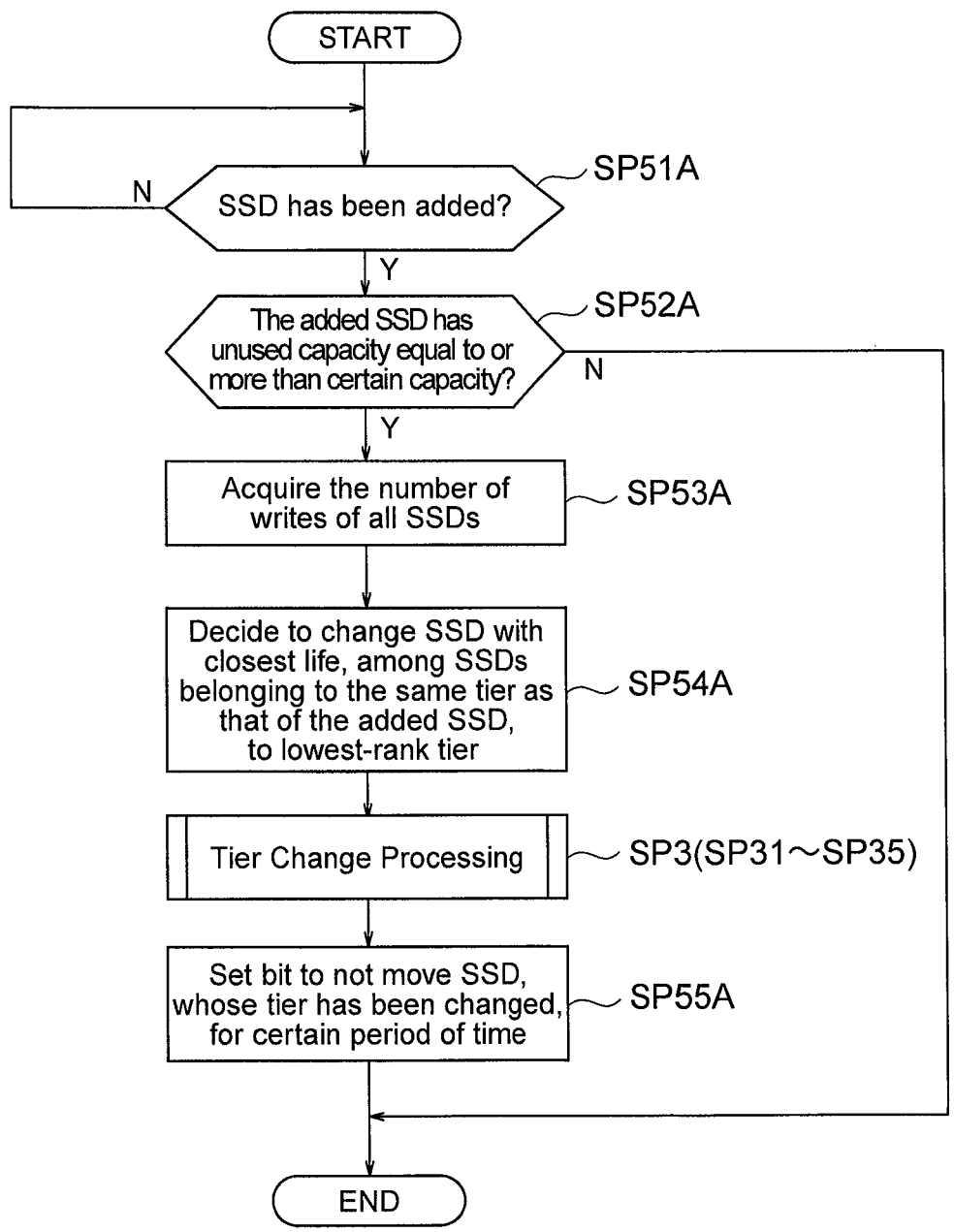
FIG. 27 is a flowchart illustrating another event driven processing.

FIG. 27 illustrates a processing sequence for another event driven processing (1) executed at the timing when an SSD 12 is additionally installed. Firstly, the CPU 111 judges whether a new SSD 12 is additionally installed in the storage apparatus 10 or not (SP51A). If the CPU 111 obtains a negative judgment result in step SP51A, it repeats the judgment in step SP51A.

On the other hand, if the CPU 111 obtains an affirmative judgment result in step SP51A, it judges whether the additionally installed SSD 12 has an unused capacity equal to or more than a certain capacity (SP52A). If the CPU 111 obtains a negative judgment result in step SP52A, it terminates this other event driven processing.

On the other hand, if the CPU 111 obtains an affirmative judgment result in step SP52A, it acquires the number of writes of all the SSDs 12 (SP53A). Then, the CPU 111 decides to change an SSD 12, which is closest to the end of its life, among other SSDs 12 belonging to the same tier as the tier to which the added SSD 12 belongs, to the lowest-rank tier (SP54A).

The CPU 111 changes the tier for the target SSD 12 to the lowest-rank tier by executing the tier change processing (from SP31 to SP35) on the SSD (target SSD) 12 concerning which the tier change was decided in step SP54A. Since the target SSD 12 whose tier is changed is not necessarily close to the end of its life, there is a possibility that it will return to a higher-rank tier again in a short period of time.

Therefore, the CPU 111 sets a bit to not change the tier, to which the target SSD 12 belongs, for a certain period of time in order to avoid frequent occurrence of tier changes (SP55A), thereby terminating this other event driven processing (1).

Figure 28:
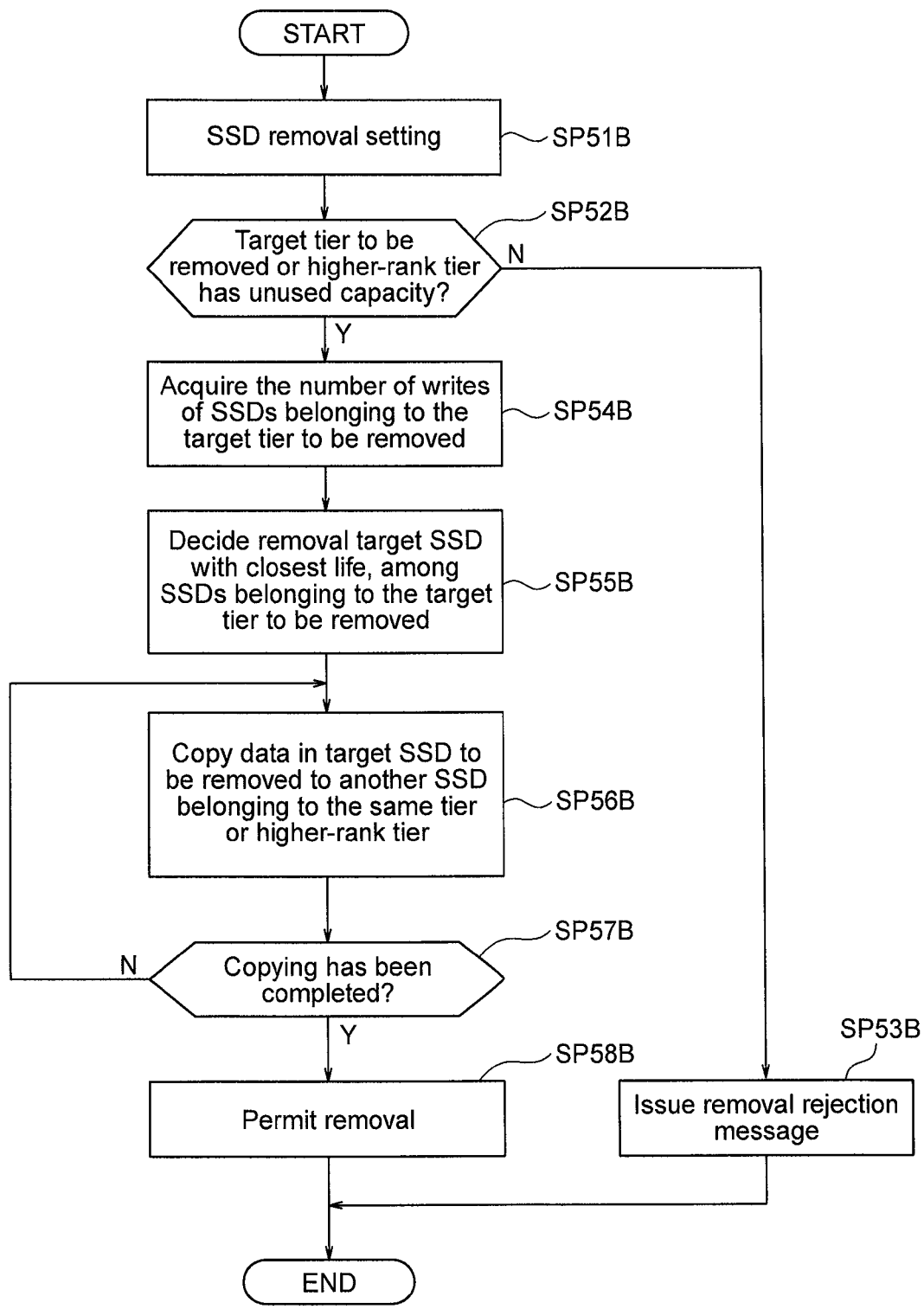
FIG. 28 is a flowchart illustrating another event driven processing.

FIG. 28 illustrates a processing sequence for another event driven processing (2) executed at the timing when an SSD 12 is removed. Firstly, when the CPU 111 detects that a removal setting to designate a tier is set to the SSDs 12 mounted in the storage apparatus 10 (SP51B), it judges whether the removal target tier or a tier whose rank is higher than that of the removal target tier has an unused capacity or not (SP52B).

If the CPU 111 obtains a negative judgment result in step SP52B, this means that if any of the SSDs 12 belonging to the removal target tier is removed, a data storage location cannot be secured. Therefore, the CPU 11 issues a removal rejection message (SP53B) and terminates this other event driven processing.

On the other hand, if the CPU 111 obtains an affirmative judgment result in step SP52B, it acquires the number of writes of the SSDs 12 belonging to the removal target tier (SP54B). Then, the CPU 111 decides an SSD 12, which is closest to the end of its life, as a removal target among the SSDs 12 belonging to the removal target tier (SP55B).

Subsequently, the CPU 111 copies data stored in the SSD 12, which is closest to the end of its life, to another SSD 12 belonging to the same tier or a tier whose rank is higher than this tier (SP56B). Then, the CPU 111 judges whether copying has been completed or not (SP57B).

If the CPU 111 obtains a negative judgment result in step SP57B, it repeats the processing in step SP56B until the completion of copying. On the other hand, if the CPU 111 obtains an affirmative judgment result in step SP57B, it sends a message notice to the operator to indicate, or displays, that the SSD 12 which is closest to the end of its life may be removed; and when the CPU 111 detects actual removal of that SSD 12 (SP58B), it terminates this other event driven processing (2).

Figure 29:
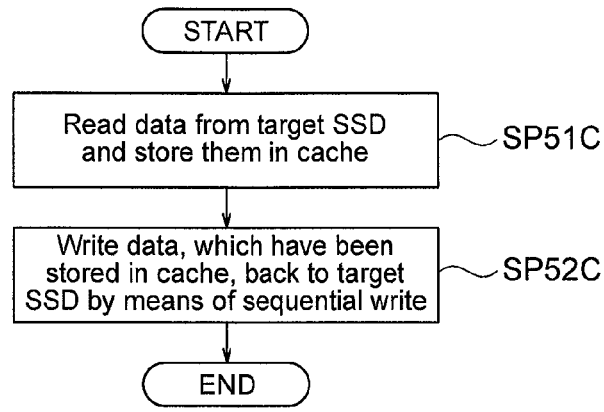
FIG. 29 is a flowchart illustrating SSD performance recovery processing.

FIG. 29 illustrates a processing sequence for performance recovery processing on an SSD 12 whose performance recovers by means of sequential writing. This performance recovery processing is processing executed on an SSD 12 whose performance has degraded and is executed as triggered by the timing of, for example, step SP52B of the other event driven processing (2) (FIG. 28).

Firstly, the CPU 111 reads data from the SSD (target SSD) 12, whose performance has degraded, and stores the data in a cache in the controller 11 (SP51C). Then, the CPU 111 rewrites the data, which are stored in the cache, to the target SSD 12 by means of sequential writing (SP52C), thereby terminating the performance recovery processing.

Figure 30:
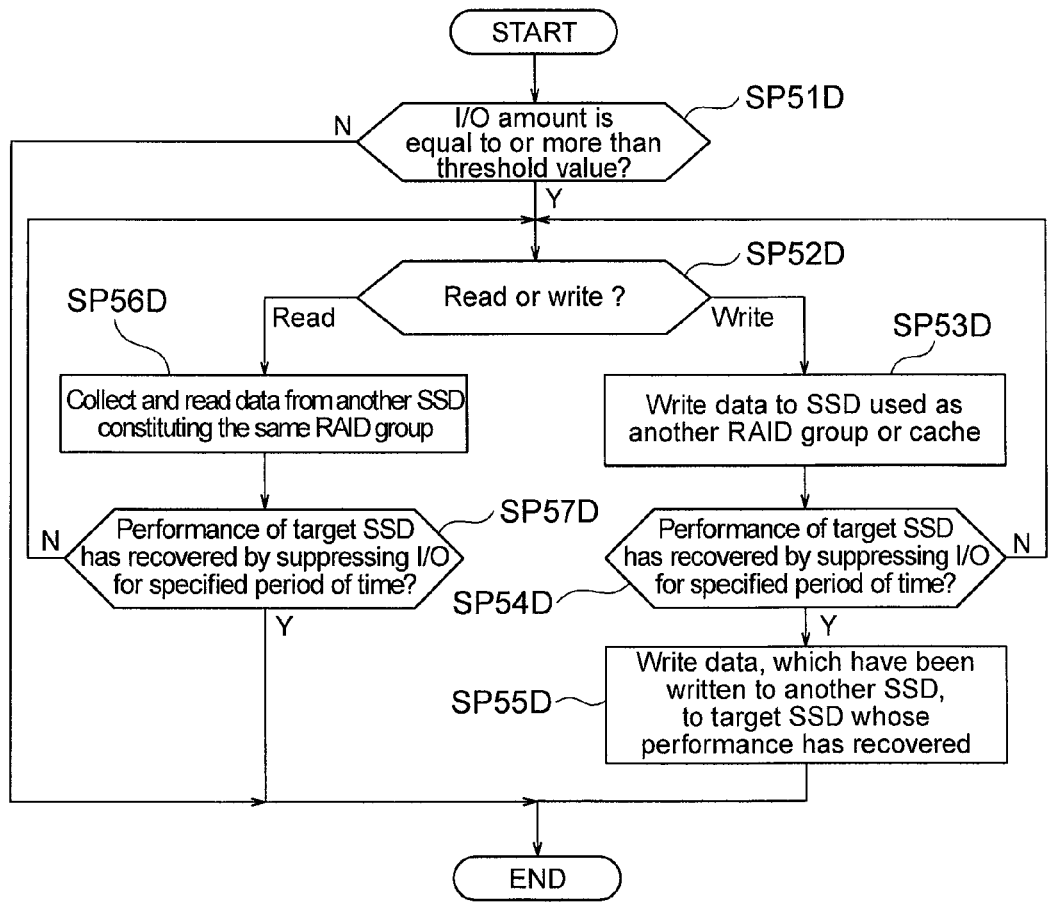
FIG. 30 is a flowchart illustrating another SSD performance recovery processing.

FIG. 30 illustrates a processing sequence for anther performance recovery processing on an SSD 12 whose performance recovers by means of I/O suppression. This other performance recovery processing is processing executed on an SSD 12, whose performance has degraded, and is executed as triggered by, for example, the same timing as the performance recovery processing in FIG. 29.

Firstly, the CPU 111 judges whether or not an I/O amount to and from the SSD 12 is equal to or more than a threshold value (SP51D). If the CPU 111 obtains a negative judgment result in step SP51D, it terminates this other performance recovery processing. On the other hand, if the CPU 111 obtains an affirmative judgment result in step SP51D, it judges whether the amount of I/O equal to or more than the threshold value is read or write (SP52D).

If the amount of I/O equal to or more than the threshold value is read, the CPU 111 collects and reads data from other SSDs 12 constituting the same RAID group as that of the SSD (target SSD) 12, from which data are read in the I/O amount equal to or more than the threshold value (SP56D), so that the I/O amount from the target SSD 12 would become less than the threshold value. Then, the CPU 111 judges whether the performance of the target SSD 12 has recovered or not by suppressing the I/O for a certain period of time (SP57D).

If the CPU 111 obtains a negative judgment result in step SP57D, it proceeds to step SP52D. On the other hand, if the CPU 111 obtains an affirmative judgment result in step SP57D, it terminates this other performance recovery processing.

Referring back to step SP52D, if the amount of I/O equal to or more than the threshold value is write, the CPU 111 writes data, which are supposed to be written to the target SSD 12, to other SSDs 12 constituting a different RAID group from that of the target SSD 12, to which data are written in the I/O amount equal to or more than the threshold value, or other SSDs 12 used as the cache, or other SSDs 12 used as journal volumes (SP53D), thereby controlling the I/O amount to the target SSD 12 to fall below the threshold value. Then, the CPU 111 judges whether the performance of the target SSD 12 has recovered or not by suppressing the I/O for a certain period of time (SP54D).

If the CPU 111 obtains a negative judgment result in step SP54D, it proceeds to step SP52D. On the other hand, if the CPU 111 obtains an affirmative judgment result in step SP54D, it writes saved data, which are written to the other SSDs 12, to the target SSD 12 whose performance has recovered (SP55D), thereby terminating this other performance recovery processing.

(3-2) Advantageous Effects of Third Embodiment

When the storage apparatus according to the third embodiment is employed as described above and any change of the configuration of SSDs mounted in the storage apparatus occurs, the storage apparatus is designed to change the tier according to the change of the SSD configuration. So, it is possible to suppress degradation of I/O processing performance in the same manner as in the first embodiment even immediately after the change of the SSD configuration.

The invention devised by the inventor of the present invention has been specifically described according to the embodiments; however, the present invention is not limited to those embodiments and it is a matter of course that the invention can be changed in various ways within a range not departing from the gist of the invention. For example, since the present invention exerts a pronounced effect particularly by the use of SSDs for which flash memories are adopted as storage devices, the property of the flash memory SSDs has been mainly described; however, the scope of the present invention is not limited to this example and the invention can be applied to SSDs, for which various semiconductor memories are adopted, and can be applied to a wide variety of computers which can be equipped with a storage apparatus or SSDs in a state where there are property differences among the SSDs.

REFERENCE SIGNS LIST

1 storage system
10 storage apparatus
11 controller
111 CPU
112 memory
1121 tables
1122 programs
12 SSD
13 I/F
20 host computer

The invention claimed is:

1. A storage apparatus equipped with a plurality of drives composed of flash memories,
the storage apparatus comprising a controller for hierarchically controlling storage areas provided by the plurality of drives by classifying the storage areas into a plurality of tiers with different performances and managing them, wherein the controller:
decides a first tier, to which each of the drives should belong, based on performance of the drive;
decides to change the tier, to which the drive should belong, from the first tier to a second tier different from the first tier based on the drive's performance, which varies depending on property of the drive; and
changes the tier, to which the drive determined to change its tier should belong, from the first tier to the second tier.

2. The storage apparatus according to claim 1, wherein the controller:
sets a boundary value between adjacent tiers based on the drive's performance, which varies depending on the property of the drive;
sets a performance width, which is predetermined based on the set boundary value, as a change width; and
decides to change the tier, to which the drive should belong, from the first tier to the second tier when the drive's performance exceeds an upper limit value or lower limit value of the change width.

3. The storage apparatus according to claim 2, wherein the controller calculates an average value of the performance of the drive belonging to the tier as the performance of the tier, calculates a median value of the performance of the tier between the adjacent tiers, and sets the calculated median value as the boundary value; and
calculates the upper limit value by adding predetermined performance to the set boundary value, calculates the lower limit value by subtracting the predetermined performance from the set boundary value, and sets a width between the calculated upper limit value and the calculated lower limit value as the change width.

4. The storage apparatus according to claim 1, wherein when the second tier is a tier whose performance is lower than that of the first tier, the controller changes the tier, to which the drive should belong, from the first tier to the second tier by migrating data with higher access frequency than a predetermined threshold value, among data stored in the drives, to another drive belonging to the first tier; and
wherein when the second tier is a tier whose performance is higher than that of the first tier, the controller changes the tier, to which the drive should belong, from the first tier to the second tier by migrating data with lower access frequency than the predetermined threshold value, among the data stored in the drives, to another drive belonging to the first tier.

5. The storage apparatus according to claim 1, wherein the controller:
manages a schedule that schedules the tier to which the drives should belong, based on the drive's performance, which varies depending on the property of the drive; and
decides to change the tier, to which the drive should belong, from the first tier to the second tier based on the scheduled schedule.

6. The storage apparatus according to claim 1, wherein when the drive's performance, which varies depending on the property of the drive, degrades and becomes lower than the drive's performance when it was mounted, by a predetermined threshold value or more, the controller recovers the drive's performance by executing sequential writing on the drives whose performance has degraded, or executing processing for suppressing reading or writing of data from or to the drive, whose performance has degraded, only for a certain period of time.

7. The storage apparatus according to claim 1, wherein the performance is the number of times the drive can read or write data per unit time, or an amount of time it takes for the drive to complete reading or writing data from a point in time when a read request or write request is made to the drive.

8. A tier control method for a storage apparatus including a controller for hierarchically controlling storage areas provided by a plurality of drives composed of flash memories by classifying the storage areas into a plurality of tiers with different performances and managing them, the tier control method comprising:
- a first step executed by the controller deciding a first tier, to which each of the drives should belong, based on performance of the drive;
- a second step executed by the controller deciding to change the tier, to which the drive should belong, from the first tier to a second tier different from the first tier based on the drive's performance, which varies depending on property of the drive; and
- a third step executed by the controller changing the tier, to which the drive determined to change its tier should belong, from the first tier to the second tier.

9. The tier control method according to claim 8, wherein in the second step, the controller:
- sets a boundary value between adjacent tiers based on the drive's performance, which varies depending on the property of the drive;
- sets a performance width, which is predetermined based on the set boundary value, as a change width; and
- decides to change the tier, to which the drive should belong, from the first tier to the second tier when the drive's performance exceeds an upper limit value or lower limit value of the change width.

10. The tier control method according to claim 9, wherein in the second step, the controller:
- calculates an average value of the performance of the drive belonging to the tier as the performance of the tier, calculates a median value of the performance of the tier between the adjacent tiers, and sets the calculated median value as the boundary value; and
- calculates the upper limit value by adding predetermined performance to the set boundary value, calculates the lower limit value by subtracting the predetermined performance from the set boundary value, and sets a width between the calculated upper limit value and the calculated lower limit value as the change width.

11. The tier control method according to claim 8, wherein in the third step, when the second tier is a tier whose performance is lower than that of the first tier, the controller changes the tier, to which the drive should belong, from the first tier to the second tier by migrating data with higher access frequency than a predetermined threshold value, among data stored in the drives, to another drive belonging to the first tier; and wherein when the second tier is a tier whose performance is higher than that of the first tier, the controller changes the tier, to which the drive should belong, from the first tier to the second tier by migrating data with lower access frequency than the predetermined threshold value, among the data stored in the drives, to another drive belonging to the first tier.

12. The tier control method according to claim 8, wherein in the second step, the controller:
- manages a schedule that schedules the tier to which the drives should belong, based on the drive's performance, which varies depending on the property of the drive; and
- decides to change the tier, to which the drive should belong, from the first tier to the second tier based on the scheduled schedule.

13. The tier control method according to claim 8, further comprising a fourth step executed, when the drive's performance, which varies depending on the property of the drive, degrades and becomes lower than the drive's performance when it was mounted, by a predetermined threshold value or more, by the controller recovering the drive's performance by executing sequential writing on the drive whose performance has degraded, or executing processing for suppressing reading or writing of data from or to the drive, whose performance has degraded, only for a certain period of time.

14. The tier control method according to claim 8, wherein the performance is the number of times the drive can read or write data per unit time, or an amount of time it takes for the drive to complete reading or writing data from a point in time when a read request or write request is made to the drive.

* * * * *